(12) United States Patent
Hirai et al.

(10) Patent No.: US 10,080,308 B2
(45) Date of Patent: Sep. 18, 2018

(54) IMMERSION COOLING APPARATUS

(71) Applicant: FUJITSU LIMITED, Kawasaki-shi, Kanagawa (JP)

(72) Inventors: Keita Hirai, Kawasaki (JP); Hideo Kubo, Kawasaki (JP); Naofumi Kosugi, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/471,706

(22) Filed: Mar. 28, 2017

(65) Prior Publication Data
US 2018/0084670 A1    Mar. 22, 2018

(30) Foreign Application Priority Data

Sep. 16, 2016  (JP) .................................. 2016-181765
Nov. 30, 2016  (JP) .................................. 2016-232901

(51) Int. Cl.
*H05K 7/20* (2006.01)
(52) U.S. Cl.
CPC ............................. *H05K 7/20236* (2013.01)
(58) Field of Classification Search
CPC . H05K 7/20218; H05K 7/20236; H05K 7/203
See application file for complete search history.

(56) References Cited

U.S. PATENT DOCUMENTS

| 4,590,538 A | 5/1986 | Cray | |
|---|---|---|---|
| 2004/0013547 A1* | 1/2004 | Allen | F04D 3/00 417/423.1 |
| 2014/0335381 A1* | 11/2014 | Krolak | H01M 10/6567 429/50 |
| 2017/0303434 A1* | 10/2017 | Katsumata | H05K 7/20381 |

FOREIGN PATENT DOCUMENTS

| JP | 59-145548 | 8/1984 |
|---|---|---|
| JP | 60-117760 | 6/1985 |
| JP | 61-059395 | 4/1986 |
| JP | 04-003451 | 1/1992 |
| JP | 2007-103820 | 4/2007 |
| JP | 2012-084260 | 4/2012 |
| JP | 2016-046431 | 4/2016 |
| WO | 2016-031781 | 3/2016 |

* cited by examiner

*Primary Examiner* — Marc Norman
(74) *Attorney, Agent, or Firm* — Fujitsu Patent Center

(57) ABSTRACT

An immersion cooling apparatus includes: a refrigerant tank configured to store a non-boiling fluorine-based insulating refrigerant in which an electronic device is to be immersed; a circulation passage of the fluorine-based insulating refrigerant that is located between the refrigerant tank and a refrigerant cooling device; and a sealed pump that is arranged in the circulation passage, is configured to seal a rotor shaft with an impeller and a bearing portion for the rotor shaft in a sealed case while the rotor shaft and the bearing portion are immersed in the fluorine-based insulating refrigerant, and is configured to circulate the fluorine-based insulating refrigerant between the refrigerant tank and the refrigerant cooling device.

12 Claims, 24 Drawing Sheets

IMMERSION COOLING APPARATUS

CROSS-REFERENCE TO RELATED APPLICATION

This application is based upon and claims the benefit of priority of the prior Japanese Patent Application No. 2016-232901, filed on Nov. 30, 2016, and the prior Japanese Patent Application No. 2016-181765, filed on Sep. 16, 2016, the entire contents of which are incorporated herein by reference.

FIELD

A certain aspect of embodiments described herein relates to an immersion cooling apparatus.

BACKGROUND

There have been conventionally known cooling systems for electronic devices using a fluorocarbon-based coolant as disclosed in Japanese Patent Application Publication No. 2016-46431 (hereinafter, referred to as Patent Document 1).

SUMMARY

According to an aspect of the present invention, there is provided an immersion cooling apparatus including: a refrigerant tank configured to store a non-boiling fluorine-based insulating refrigerant in which an electronic device is to be immersed; a circulation passage of the fluorine-based insulating refrigerant that is located between the refrigerant tank and a refrigerant cooling device; and a sealed pump that is arranged in the circulation passage, is configured to seal a rotor shaft with an impeller and a bearing portion for the rotor shaft in a sealed case while the rotor shaft and the bearing portion are immersed in the fluorine-based insulating refrigerant, and is configured to circulate the fluorine-based insulating refrigerant between the refrigerant tank and the refrigerant cooling device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
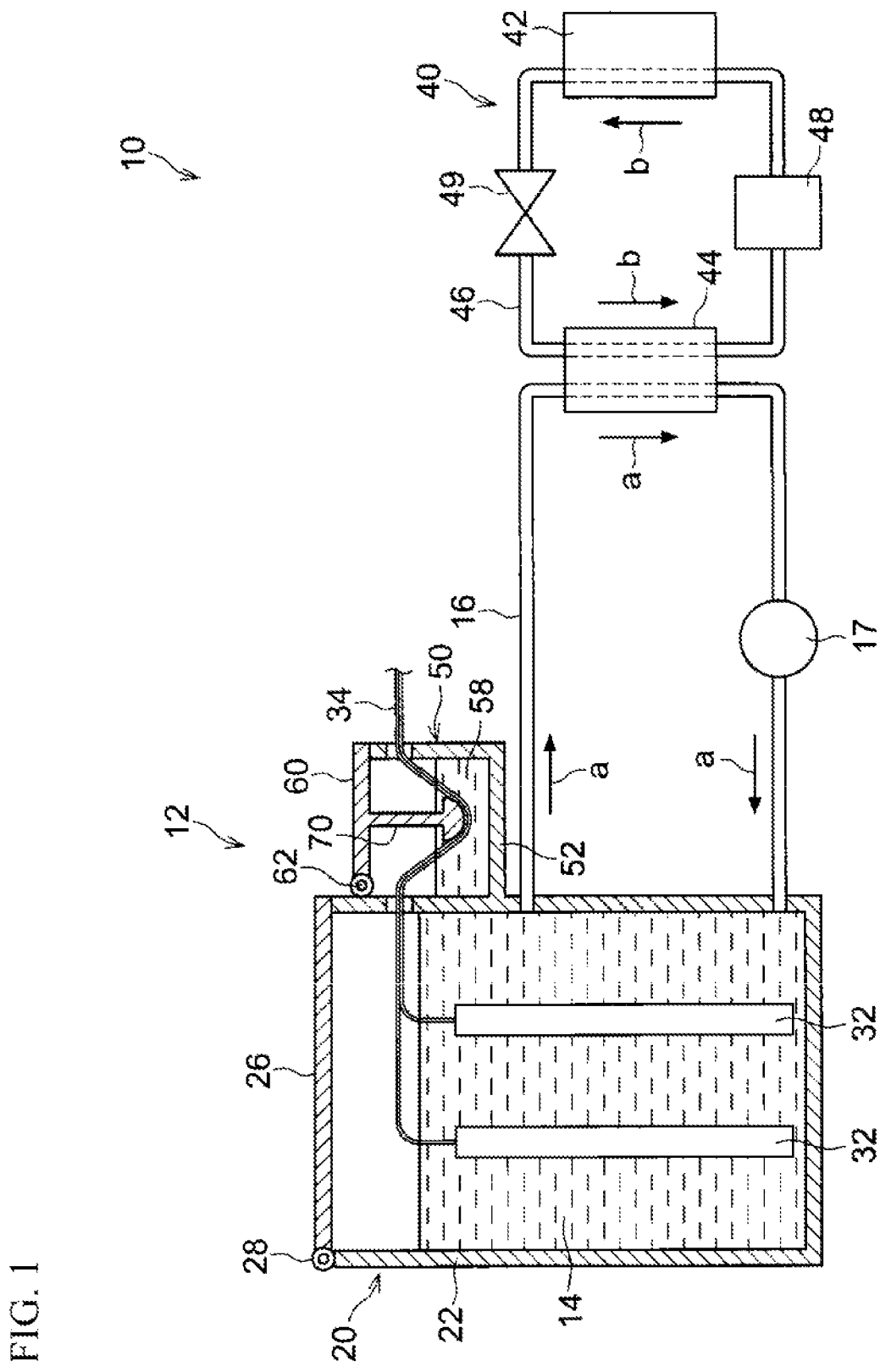
FIG. 1 illustrates a system structure of an immersion cooling system in accordance with a first embodiment.

Fluorine-based insulating refrigerants such as the fluorocarbon-based coolant used in Patent Document 1 usually have high penetration, and may erode seal materials used in axial pumps or the like, causing the leakage of the refrigerants. To deal with the leakage of the refrigerant, it may be considered to employ a sealed pump, such as a magnet pump or a canned pump, that seals a rotor shaft having an impeller and a bearing portion for the rotor shaft in a sealed case while the rotor shaft and the bearing portion are immersed in a liquid.

However, the sealed pump has a drive force less than that of the axial pump or the like because of its structure, and it is considered difficult to obtain the flow rate per unit time of the refrigerant. When the flow rate per unit time of the refrigerant is small, it may become difficult to appropriately cool the refrigerant.

Hereinafter, a description will be given of embodiments of the present invention with reference to the accompanying drawings. In the drawings, the dimensions of each portion, the ratio, or the like may be not always illustrated so as to completely correspond to the actual ones. In some drawings, for convenience sake, components that are present in practice may be omitted or dimensions may be exaggerated.

First Embodiment

Figure 2:
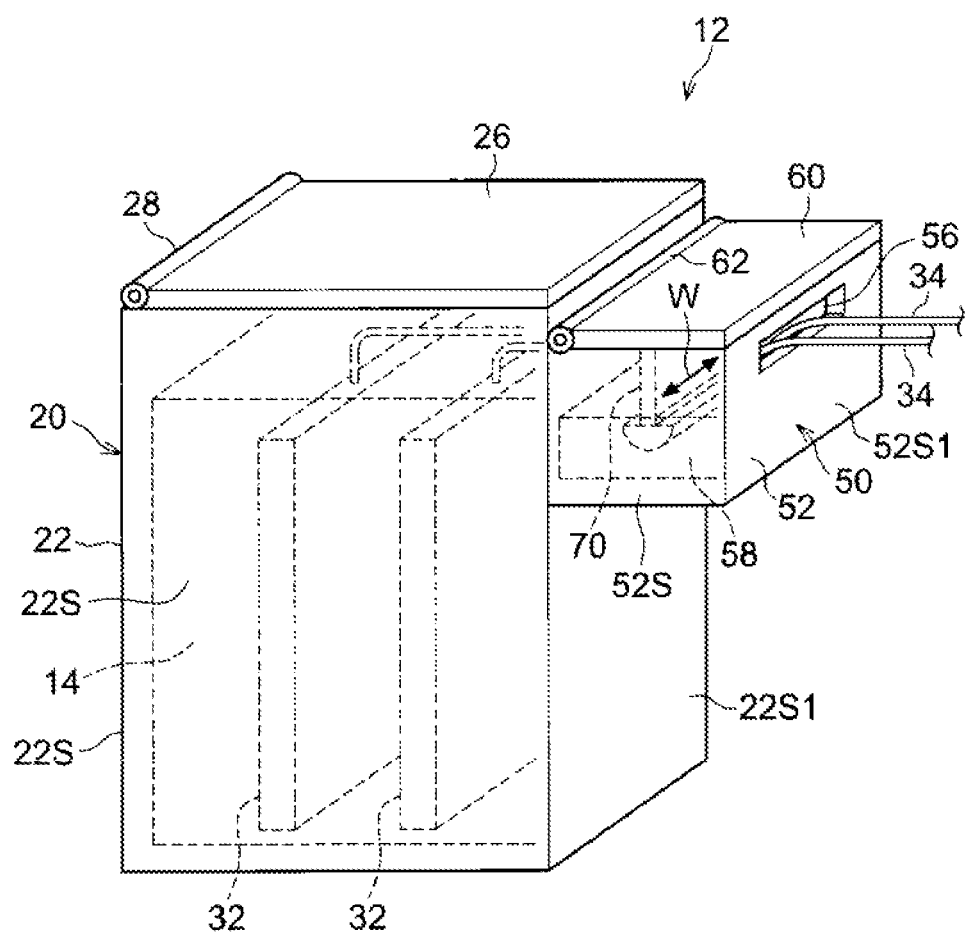
FIG. 2 is a perspective view illustrating a refrigerant tank and a sealed tank illustrated in FIG. 1.
Figure 3:
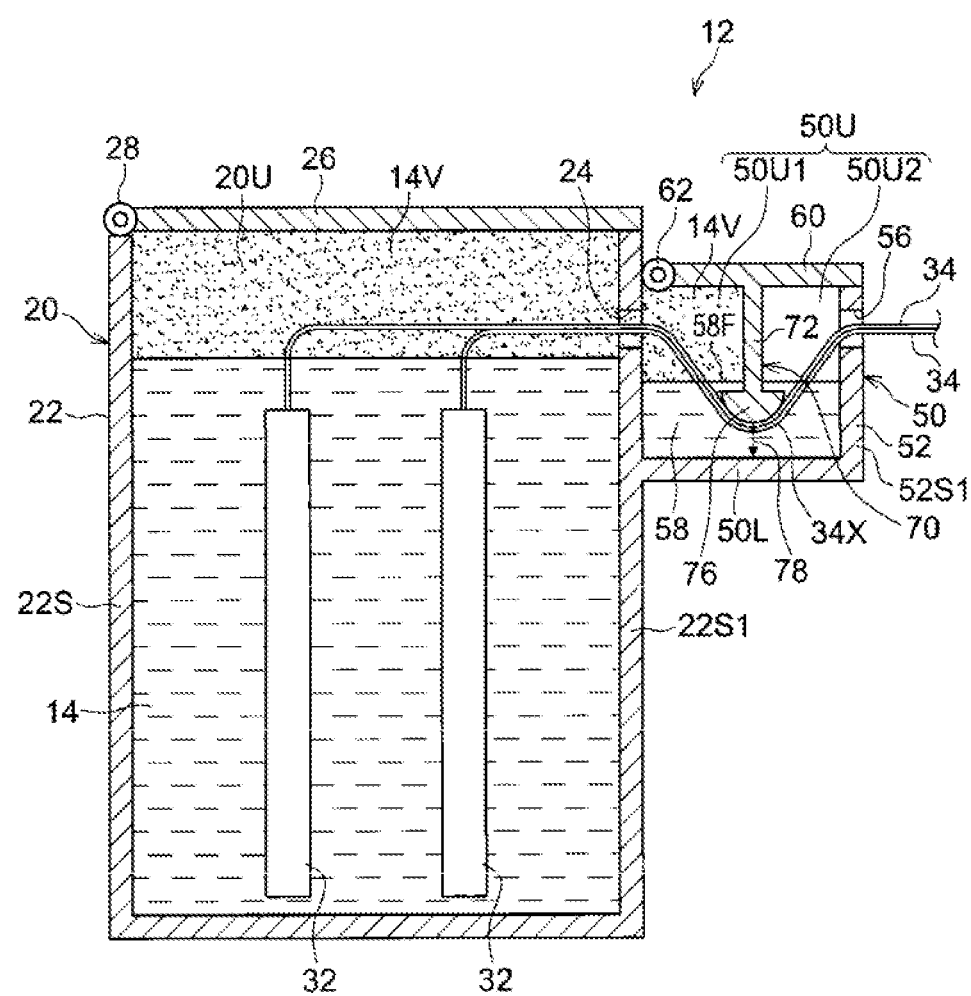
FIG. 3 is a vertical cross-sectional view of the refrigerant tank and the sealed tank illustrated in FIG. 2.
Figure 4:
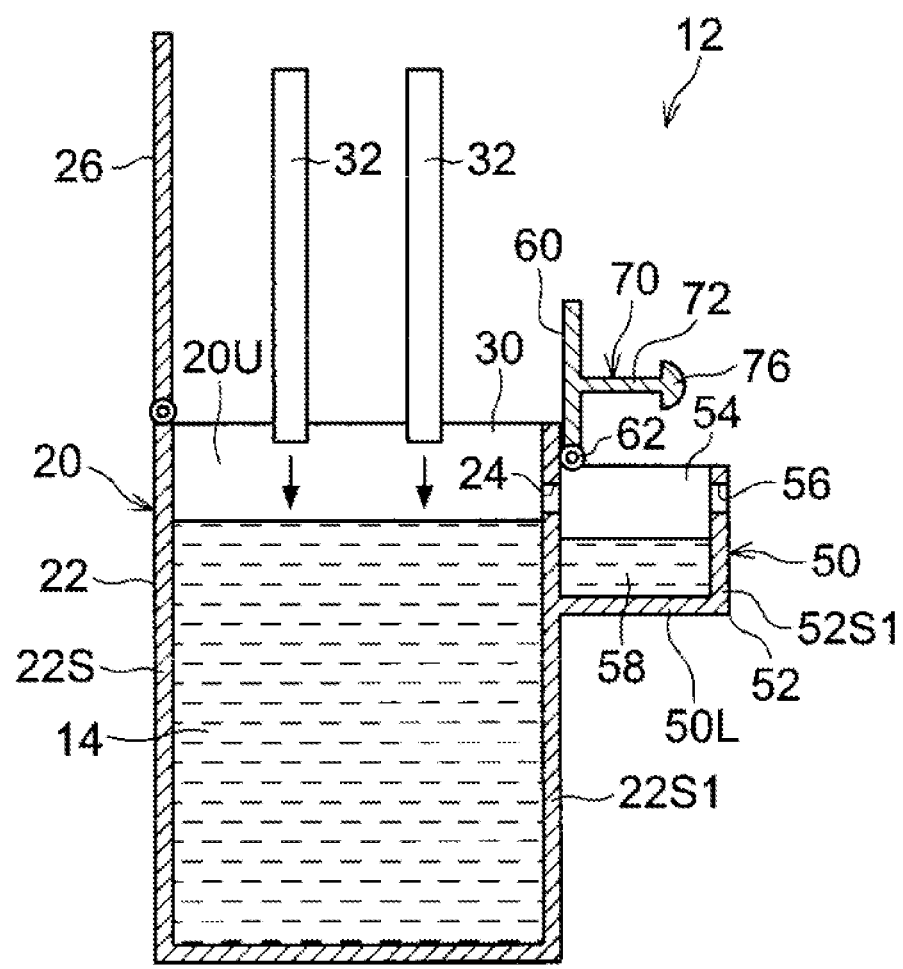
FIG. 4 is a vertical cross-sectional view illustrating a state where a refrigerant tank lid and a sealed tank lid illustrated in FIG. 3 are opened.
Figure 5:
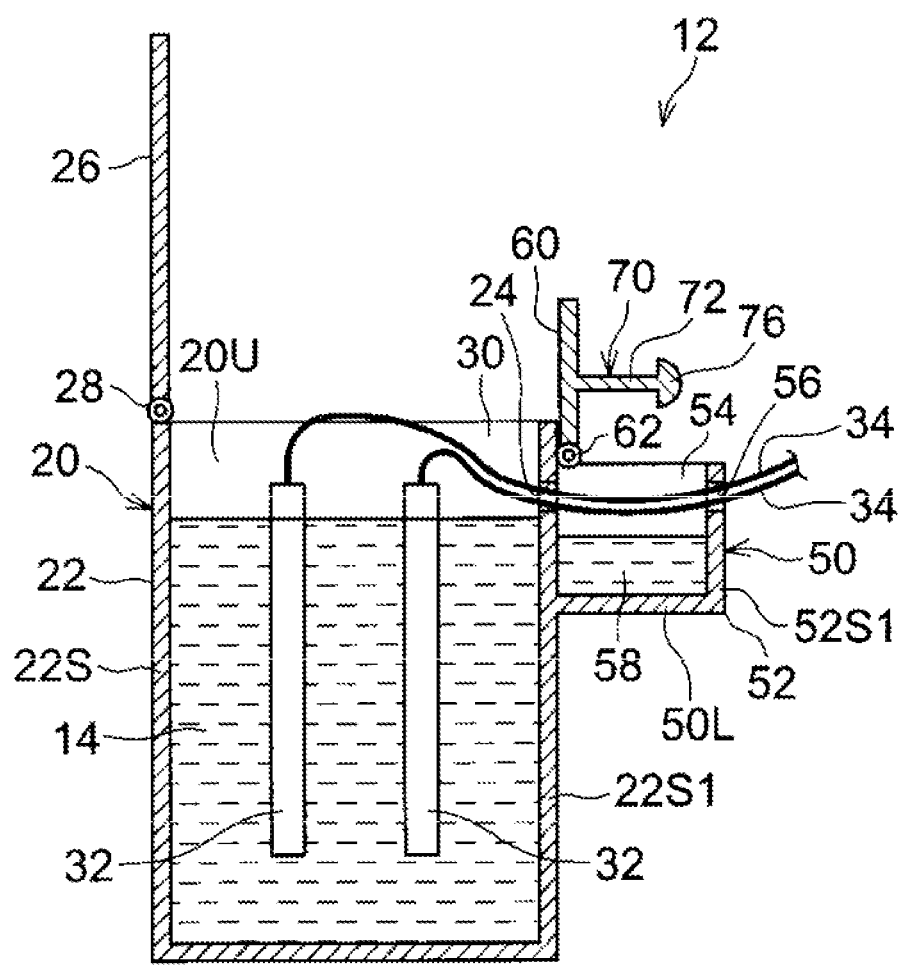
FIG. 5 is a vertical cross-sectional view illustrating a process of accommodating an electronic device in the refrigerant tank illustrated in FIG. 4.
Figure 6:
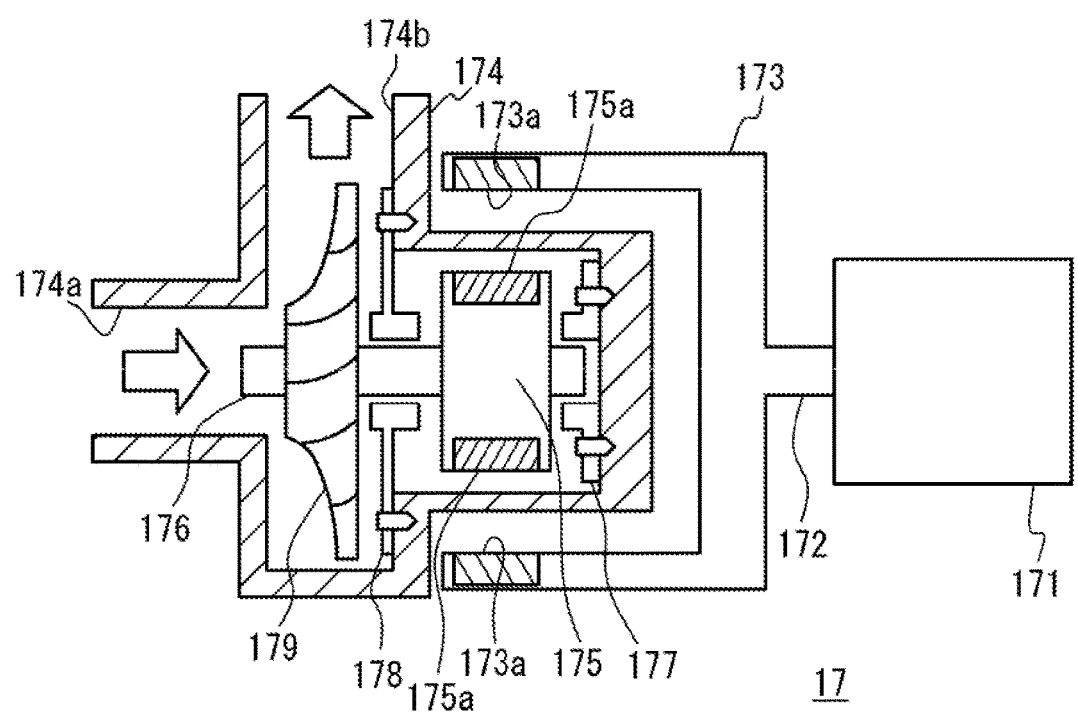
FIG. 6 is an explanatory diagram schematically illustrating an outline structure of a magnet pump included in the immersion cooling apparatus of the first embodiment.
Figure 7:
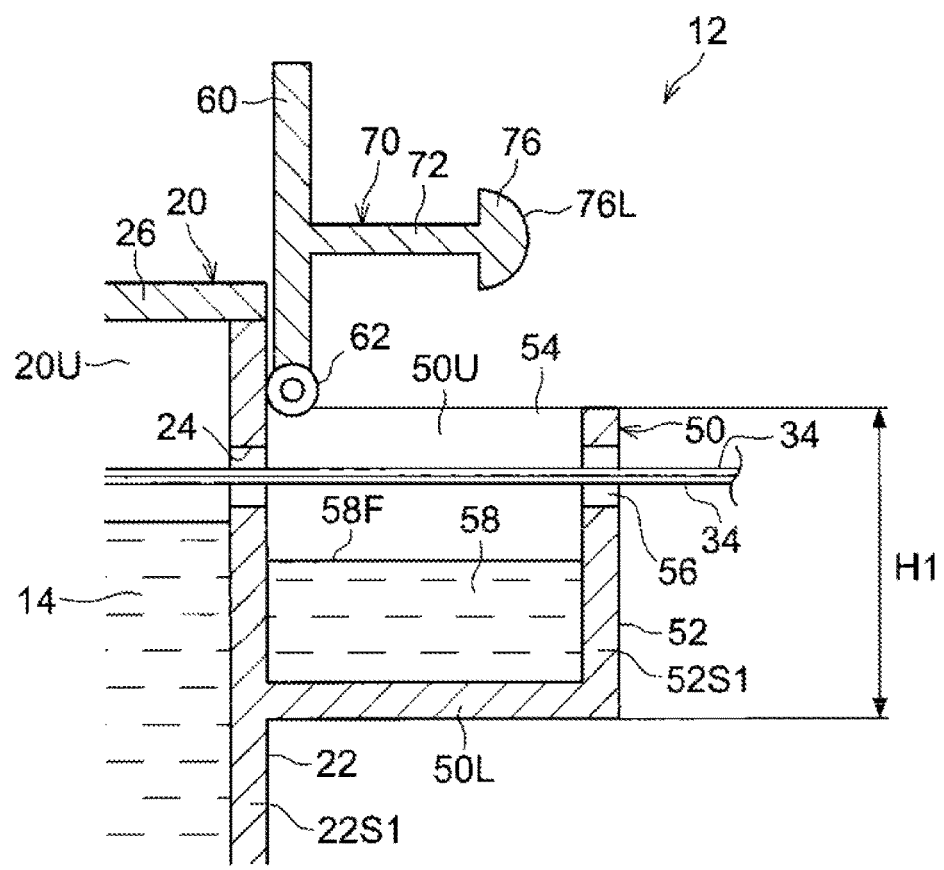
FIG. 7 is an enlarged cross-sectional view of the sealed tank illustrated in FIG. 5.
Figure 8:
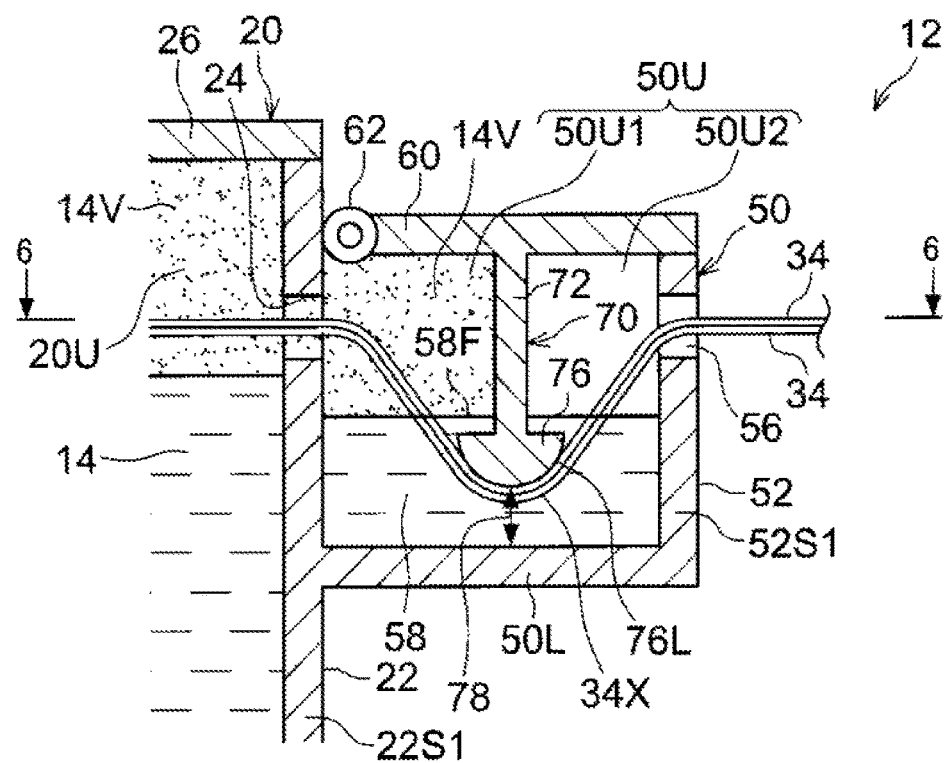
FIG. 8 is a cross-sectional view illustrating a state where the sealed tank lid illustrated in FIG. 7 is closed.
Figure 9:
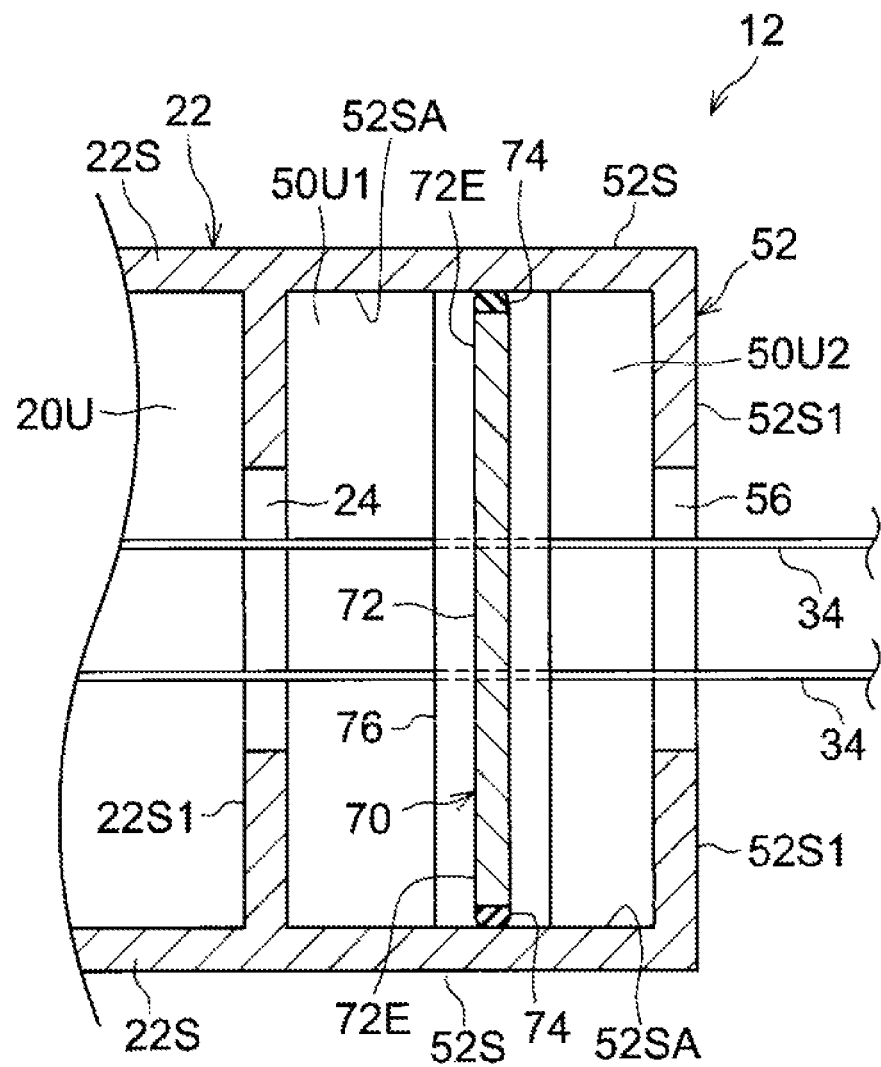
FIG. 9 is a cross-sectional view taken along line 6-6 in FIG. 8.

With reference to FIG. 1 through FIG. 9, an outline structure of an immersion cooling system 10 including an immersion cooling apparatus 12 of a first embodiment will be described. FIG. 1 illustrates a system structure of an immersion cooling system in accordance with the first embodiment. FIG. 2 is a perspective view of a refrigerant tank and a sealed tank illustrated in FIG. 1. FIG. 3 is a vertical cross-sectional view of a refrigerant tank and a sealed tank illustrated in FIG. 2. FIG. 4 is a vertical cross-sectional view illustrating a state where a refrigerant tank lid and a sealed tank lid illustrated in FIG. 3 are opened. FIG. 5 is a vertical cross-sectional view illustrating a process of accommodating an electronic device in the refrigerant tank illustrated in FIG. 4. FIG. 6 is an explanatory diagram schematically illustrating an outline structure of a magnet pump included in the immersion cooling apparatus of the embodiment. FIG. 7 is an enlarged cross-sectional view illustrating the sealed tank illustrated in FIG. 5. FIG. 8 is a cross-sectional view illustrating a state where the sealed tank lid illustrated in FIG. 7 is closed. FIG. 9 is a cross-sectional view taken along line 6-6 in FIG. 8.

Immersion Cooling System

As illustrated in FIG. 1, the immersion cooling system 10 in accordance with the embodiment includes the immersion cooling apparatus 12 and a refrigerant cooling device 40. The immersion cooling apparatus 12 includes a refrigerant tank 20 as described in detail later, and includes a circulation passage 16 that couples the refrigerant tank 20 to the refrigerant cooling device 40.

Immersion Cooling Apparatus

As illustrated in FIG. 2, the immersion cooling apparatus 12 includes the refrigerant tank 20 and a sealed tank 50. The refrigerant tank 20 is a sealed container (a hermetic container) that accommodates a fluorine-based insulating refrigerant (hereinafter, referred to as a refrigerant liquid) 14. The refrigerant tank 20 includes a refrigerant tank main body 22 and a refrigerant tank lid 26. The refrigerant tank main body 22 is a box-shaped container having an opening 30 (see FIG. 4) in the upper section.

The refrigerant tank main body 22 has four side walls 22S. As illustrated in FIG. 3, a connecting opening 24 is formed in the upper part of a predetermined side wall 22S1 of the four side walls 22S of the refrigerant tank main body 22. The connecting opening 24 is, for example, a rectangular penetration hole that penetrates through the side wall 22S in the thickness direction.

The refrigerant tank main body 22 accommodates (stores) the refrigerant liquid 14. The refrigerant liquid 14 is supplied into the refrigerant tank main body 22 from the opening 30 so as not to leak from the connecting opening 24. In addition, while the refrigerant liquid 14 is accommodated in the refrigerant tank main body 22, the upper part of the refrigerant tank main body 22 (the refrigerant tank 20) is made to be a space without the refrigerant liquid 14 (hereinafter, referred to as an "upper space 20U").

The refrigerant liquid 14 is a liquid (liquid refrigerant) that has electric insulation and thermal conductivity, and easily vaporizes at normal temperature. The term "normal temperature" means, for example, the average yearly temperature in the area where the immersion cooling apparatus 12 is installed. Examples of the above refrigerant liquid 14 include, but are not limited to, Fluorinert™ manufactured by 3M, and Novec™ also manufactured by 3M. In addition, there are ASAHIKLIN™ available from Asahi Glass Co., Ltd., and Galden™ available from Solvay. Since the above-described refrigerant liquids 14 have electric insulation, they are suitable for cooling an electronic device 32 with the electronic device 32 immersed therein. The refrigerant liquid 14 will be described in detail later.

The refrigerant tank lid 26 is attached to the top edge of the refrigerant tank main body 22 via a hinge 28. As illustrated in FIG. 4, the refrigerant tank lid 26 rotates around the hinge 28 with respect to the refrigerant tank main body 22, opening and closing the opening 30 of the refrigerant tank main body 22. In addition, a seal material, which is not illustrated, is provided in the periphery of the opening 30 of the refrigerant tank main body 22. Accordingly, while the refrigerant tank lid 26 is closed, the clearance between the refrigerant tank lid 26 and the periphery of the opening 30 is hermetically sealed by the seal material. The refrigerant tank 20 is hermetically sealed during the operation of the immersion cooling apparatus 12, and thereby the evaporation of the refrigerant liquid 14 is inhibited.

As illustrated in FIG. 3, a plurality of electronic devices 32 as cooling objects are accommodated in the refrigerant tank 20. Each electronic device 32 is put into the refrigerant tank main body 22 from the opening 30. In addition, each electronic device 32 is accommodated in the refrigerant tank main body 22 while being immersed in the refrigerant liquid 14.

Each electronic device 32 is, for example, a server including a printed-circuit board on which a plurality of electronic components are mounted and a housing that houses the printed-circuit board. In addition, a cable 34 is electrically connected to the printed-circuit board of the electronic device 32. The cable 34 is wired from the upper space 20U of the refrigerant tank 20 to an upper space 50U of the sealed tank 50 described later through the connecting opening 24 as illustrated in FIG. 5.

As illustrated in FIG. 1, the refrigerant cooling device 40 is coupled to the refrigerant tank 20 via the circulation passage 16. The circulation passage 16 circulates the refrigerant liquid 14 between the refrigerant tank 20 and the refrigerant cooling device 40. Thus, the circulation passage 16 is formed of a pipe through which the refrigerant liquid 14 flows. In addition, a pump 17 is located in the circulation passage 16. When the pump 17 is driven, the refrigerant liquid 14 is circulated between the refrigerant tank 20 and the refrigerant cooling device 40. Arrows a illustrated in FIG. 1 indicate the circulation direction of the refrigerant liquid 14.

The pump 17 in the present embodiment is a magnet pump. The magnet pump is an example of the sealed pump. As illustrated in FIG. 6, the pump 17 includes a motor 171. The motor 171 includes a rotary case 173 attached to a motor shaft 172. The rotary case 173 has a cylindrical shape, and includes an external magnet 173a in the inner periphery thereof. The pump 17 includes a sealed case 174. The sealed case 174 has an inlet 174a and an outlet 174b of the refrigerant liquid 14.

A rotor 175 is housed inside the sealed case 174. An internal magnet 175a is located on the outer periphery of the rotor 175. The rotor 175 includes a rotor shaft 176. The rotor shaft 176 is rotatably supported by a first bearing portion 177 and a second bearing portion 178 that are located inside the sealed case 174. Neither the first bearing portion 177 nor the second bearing portion 178 penetrate through the sealed case 174.

An impeller 179 is attached to the end portion of the rotor shaft 176. The internal magnet 175a faces the external magnet 173a across the sealed case 174. Accordingly, when the motor 171 rotates, the rotor 175 rotates, and eventually the impeller 179 rotates. The rotation of the impeller 179 causes the refrigerant liquid 14 introduced into the sealed case 174 from the inlet 174a to be discharged from the outlet 174b. As described above, the pump 17 of the present embodiment seals the rotor shaft 176 with the impeller 179, the first bearing portion 177, and the second bearing portion 178 in the sealed case 174 while the rotor shaft 176, the first bearing portion 177, and the second bearing portion 178 are immersed in the refrigerant liquid 14.

The sealed case 174 is separated from the outside, and seals the refrigerant liquid 14 with a metal. Thus, the pump 17 can inhibit liquid leakage as much as possible even when the refrigerant liquid 14 with high penetration is used.

Refrigerant Cooling Device

The refrigerant cooling device 40 is, for example, a refrigerator that uses a refrigeration cycle to cool the refrigerant liquid 14. The heat exchange between the refrigerant liquid 14 cooled by the refrigerant cooling device 40 and the electronic device 32 cools the electronic device 32.

For example, the refrigerant cooling device 40 includes a condenser 42 and a heat exchanger 44. The condenser 42 and the heat exchanger 44 are interconnected through a refrigerant circulation passage 46. The refrigerant circulation passage 46 is formed of a pipe through which the refrigerant flows. Arrows b illustrated in FIG. 1 indicate the circulation direction of the refrigerant.

In addition, a compressor 48 is located in the refrigerant circulation passage 46. The compressor 48 compresses the refrigerant in a vapor state flowing from the heat exchanger 44 to the condenser 42. The condenser 42 includes cooling fans that cool the refrigerant in a vapor state compressed by the compressor 48. The cooling fans are not illustrated. The cooling of the refrigerant in a vapor state by the cooling fans condenses the refrigerant.

An expansion valve 49 is also located in the refrigerant circulation passage 46. The expansion valve 49 expands the refrigerant in a liquid state flowing from the condenser 42 to the heat exchanger 44 to reduce the pressure thereof. The heat exchanger 44 causes the refrigerant in a liquid phase of which the pressure is reduced by the expansion valve 49 to exchange heat with the refrigerant liquid 14 flowing through the circulation passage 16 to vaporize the refrigerant. Accordingly, the latent heat of vaporization of the refrigerant is taken from the refrigerant liquid 14, and the refrigerant liquid 14 is thereby cooled.

The refrigerant vaporized by the heat exchanger 44 is compressed by the compressor 48, and then condensed by the condenser 42 described previously. As described above, the refrigerant liquid 14 is cooled by circulating the refrigerant through the compressor 48, the condenser 42, the expansion valve 49, and the heat exchanger 44.

The refrigerant cooling device 40 may have other structures as long as it can cool the refrigerant liquid 14.

Sealed Tank

As illustrated in FIG. 7 and FIG. 8, the sealed tank 50 is located adjacent to the refrigerant tank 20. The sealed tank 50 is a container that accommodates a sealing liquid 58. The sealed tank 50 includes a sealed tank main body 52 and a sealed tank lid 60. The sealed tank main body 52 is a box-shaped container having a sealed tank opening 54 in the upper section. The sealed tank main body 52 have a plurality of side walls 52S (see FIG. 2). The sealed tank main body 52 and the refrigerant tank main body 22 previously described share the side wall 22S1.

In addition, the sealed tank main body 52 has a side wall 52S1 facing the side wall 22S1. In the upper part of the side wall 52S1, formed is a cable drawing-out opening 56 for drawing out the cable 34 to the outside of the sealed tank 50. The cable drawing-out opening 56 is, for example, a rectangular opening that penetrates through the side wall 52S1 in the thickness direction.

The sealing liquid 58 is accommodated (stored) in the sealed tank main body 52. Used for the sealing liquid 58 is a liquid (a liquid seal material) such as water or oil that hardly vaporizes at normal temperature, and in which the refrigerant liquid 14 hardly dissolves. The sealing liquid 58 is supplied from the sealed tank opening 54 into the sealed tank main body 52 so as not to leak from the connecting opening 24 and the cable drawing-out opening 56. Additives for inhibiting the growth of algae and moss may be added to the sealing liquid 58. The sealing liquid 58 is an example of the seal material.

While the sealing liquid 58 is accommodated in the sealed tank main body 52, the upper part of the sealed tank main body 52 is made to be a space without the sealing liquid 58 (hereinafter, referred to as the "upper space 50U"). The upper space 50U of the sealed tank 50 is connected with (communicated with) the upper space 20U of the refrigerant tank 20 described previously through the connecting opening 24.

The sealed tank lid 60 is attached to the top edge of the sealed tank main body 52 via a hinge 62. The rotation of the sealed tank lid 60 around the hinge 62 opens and closes the sealed tank opening 54 of the sealed tank main body 52. In addition, a seal material that is not illustrated is located in the periphery of the sealed tank opening 54. Thus, while the sealed tank lid 60 is closed, the clearance between the sealed tank lid 60 and the periphery of the sealed tank opening 54 is hermetically sealed by the seal material.

As illustrated in FIG. 7, a partition member 70 is mounted on the sealed tank lid 60. The partition member 70 includes a partition portion 72 and a press portion 76. The partition portion 72 is formed into a sheet. The partition portion 72 extends downward from the bottom of the sealed tank lid 60 and faces the side wall 22S1 of the refrigerant tank main body 22 while the sealed tank lid 60 is closed.

As illustrated in FIG. 9 that illustrates the immersion cooling apparatus 12 viewed from directly above, a seal material 74 is located in both end portions 72E in the width direction of the partition portion 72. The seal material 74 is located along the end portion 72E of the partition portion 72. The seal material 74 is pressed against and in contact with an inner wall surface 52SA of the side wall 52S of the sealed tank main body 52 while the sealed tank lid 60 is closed. Thus, while the sealed tank lid 60 is closed, the clearance between the end portion 72E of the partition portion 72 and the inner wall surface 52SA of the sealed tank main body 52 is sealed.

In addition, as illustrated in FIG. 8, while the sealed tank lid 60 is closed, the lower end of the partition portion 72 (the tip in the extension direction) makes contact with (is immersed in) the sealing liquid 58. Accordingly, the upper space 50U of the sealed tank 50 is partitioned into a first space 50U1 and a second space 50U2 by the partition portion 72 of the partition member 70.

The first space 50U1 is formed closer to the refrigerant tank 20 with respect to the partition portion 72. The first space 50U1 is connected to (communicated with) the upper space 20U of the refrigerant tank 20 through the connecting opening 24. In addition, while the refrigerant tank lid 26 and the sealed tank lid 60 are closed, the upper space 20U of the refrigerant tank 20 and the first space 50U1 of the sealed tank 50 are made to be a sealed space (a hermetic space). The lower side of the first space 50U1 is blocked by a surface 58F of the sealing liquid 58.

The second space 50U2 is formed at the opposite side of the partition portion 72 from the refrigerant tank 20. The second space 50U2 is connected to (communicated with) the outside of the sealed tank 50 through the cable drawing-out opening 56.

The press portion 76 is formed in the lower end of the partition portion 72. The cross-sectional shape of the press portion 76 is a semicircular shape. The press portion 76 is immersed in the sealing liquid 58 while separating from a bottom 50L of the sealed tank 50. Accordingly, while the sealed tank lid 60 is closed, a wiring space 78 for the cable 34 is formed between the press portion 76 and the bottom 50L of the sealed tank 50. In other words, the partition member 70 divides the upper space 50U of the sealed tank 50 while leaving the wiring space 78 for the cable 34 between the partition member 70 and the bottom 50L of the sealed tank 50. The wiring space 78 is formed along the entire length of the partition member 70 in the width direction (the direction indicated by the arrow W in FIG. 2).

In addition, a lower surface 76L of the press portion 76 curves so as to protrude downward. The lower surface 76L submerges the cable 34 in the sealing liquid 58. Accordingly, a part 34X of the cable 34 is immersed in the sealing liquid 58 while being curved. The press portion 76 is an example of the lower end of the partition member 70.

Here, when the curvature of the part (curved part) 34X of the curved cable 34 becomes equal to or greater than a predetermined value, the part 34X may be damaged. As a countermeasure for it, the present embodiment makes the curvature of the lower surface 76L of the press portion 76 less than a predetermined curvature at which the cable 34 is damaged. This configuration inhibits the damage to the part 34X when the part 34X of the cable 34 curves along the lower surface 76L of the press portion 76.

The above described structure is the outline structure of the immersion cooling system 10 of the present embodiment. Here, the refrigerant liquid 14 used in the present embodiment will be described in detail. The immersion cooling system 10 of the present embodiment operates so that a non-boiling state of the refrigerant liquid 14 is kept. The refrigerant liquid 14 in the present embodiment is a fluorine-based insulating refrigerant, and its boiling point is 60° C. or greater and its kinetic viscosity at 25° C. is 1 cSt or less. The reason why the boiling point is specified to be 60° C. or greater is because the temperature during the operation of the electronic device 32 is considered. That is, if the temperature of the refrigerant liquid 14 exceeds its boiling point when the electronic device 32 is operating, the refrigerant liquid 14 boils, and appropriate cooling becomes impossible. To avoid this sort of problem, the boiling point is specified as described above. By specifying the boiling point of the refrigerant liquid 14 to be 60° C. or greater, the immersion cooling system 10 can be made to be a system that never boils.

In addition, the condition that the kinetic viscosity at 25° C. is 1 cSt or less is specified to secure the flow rate, specifically, the flow rate per unit time, of the pump 17. The reason why the kinetic viscosity at 25° C. is used as the base is because the temperature of the refrigerant liquid 14 when the electronic device 32 is operating is considered. The temperature of the refrigerant liquid 14 during the operation of the electronic device 32 is controlled to be 25 to 40° C. to make the electronic device 32 appropriately operate. Thus, the kinetic viscosity at the temperature of the refrigerant liquid 14 during the operation of the electronic device 32 is used as the condition.

The reason why the condition relating to the kinetic viscosity is set is because the kinetic viscosity of the refrigerant liquid 14 correlates with the flow velocity, i.e., the flow rate per unit time, of the refrigerant liquid 14 that affects the coolability of the immersion cooling apparatus 12. High-heat generating elements including a Central Processing Unit (CPU) are installed in the electronic device 32, and to cool them, the flow rate (flow velocity) of the refrigerant liquid 14 is to be increased to improve the coolability of the immersion cooling apparatus 12. However, on the other hand, the pressure loss increases as the flow rate (flow velocity) increases. The pressure loss is proportional to the kinetic viscosity of the refrigerant liquid 14. For example, when fluid flows in a laminar flow state, the pressure loss is proportional to the kinetic viscosity, while when fluid flows in a turbulent flow state, the pressure loss is proportional to the one-fourth power of the kinetic viscosity. When a liquid with a high kinetic viscosity is used and the flow rate (flow velocity) is increased, the pressure loss increases, and therefore, a powerful, large pump is needed. However, a magnet pump is employed for the pump 17 of the present embodiment in consideration of the leakage of the refrigerant liquid 14 and the erosion of the sealing portion by the refrigerant liquid 14. The magnet pump is less powerful than the axial pump. That is, the magnet pump has characteristics that its delivery force of the liquid significantly decreases when the liquid to be discharged has a high specific gravity and a high viscosity because its axial force is weak.

With reference to the following Table 1 and the graph illustrated in FIG. 10, the characteristics of the magnet pump will be described. Table 1 lists the exemplary performance exhibited by a magnet pump that can be employed as the pump of the present embodiment, and FIG. 10 is a graph in which the values in Table 1 are plotted.

TABLE 1

| Flow rate [L/min] | Pump head [m] |
|---|---|
| 0 | 25 |
| 25 | 24.7 |
| 50 | 24 |
| 75 | 22.5 |
| 100 | 20 |
| 125 | 17.5 |

Figure 10:
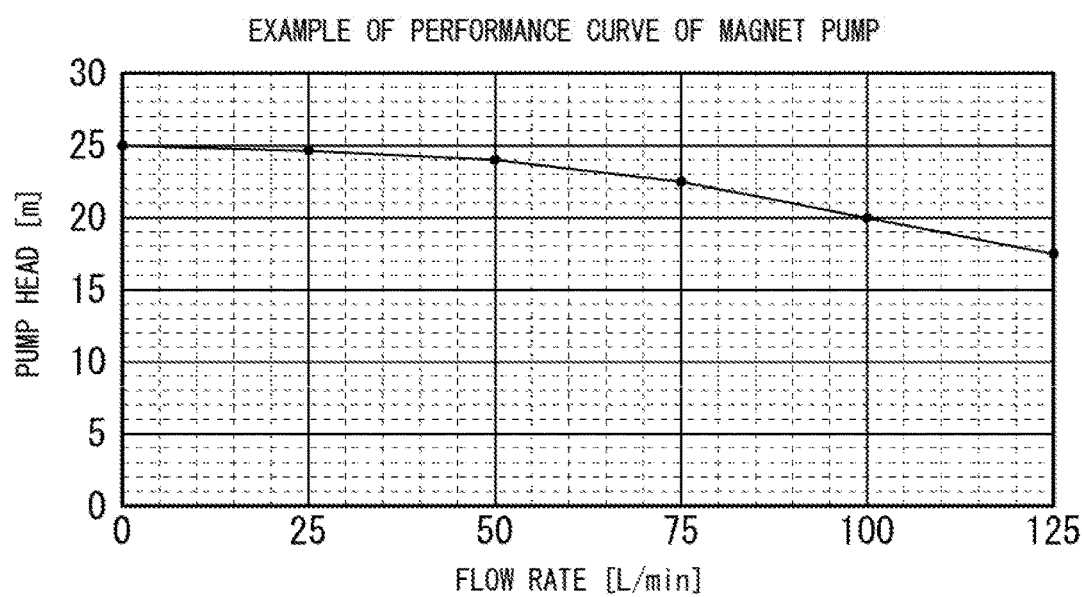
FIG. 10 is a graph illustrating a performance curve of a magnet pump.

According to Table 1 and the graph illustrated in FIG. 10, for example, when the pump head is 24.7 m, the flow rate (short-time flow rate) is 25 L/min, while when the pump head is 24 m, the flow rate (short-time flow rate) is 50 L/min. This reveals that even the improvement of a small pressure loss difference of 0.7 m (=7 kPa) of the pump head doubles the flow rate (increase by 25 L/min). Thus, when the flow rate of the refrigerant liquid 14 doubles, the amount of heat that can be transported doubles. Therefore, for example, even when the number of the electronic devices 32 to be disposed in the refrigerant tank 20 doubles, appropriate cooling is possible.

The kinetic viscosity of the refrigerant liquid 14 is determined in consideration of the above conditions. The reason why the kinetic viscosity is specified to be 1 cSt or less is to make the kinetic viscosity of the refrigerant liquid 14 approximately equal to the kinetic viscosity of water. Commonly employed magnet pumps are designed under the assumption that the pump discharges water. Therefore, if a liquid with a kinetic viscosity of 1 cSt or less is employed as the refrigerant liquid 14, commercially available magnet pumps can be used. That is, the versatility is enhanced, and the cost of the immersion cooling apparatus 12 can be reduced. Since the pressure loss can be reduced as the kinetic viscosity decreases, a lower kinetic viscosity is preferable.

Figure 11:
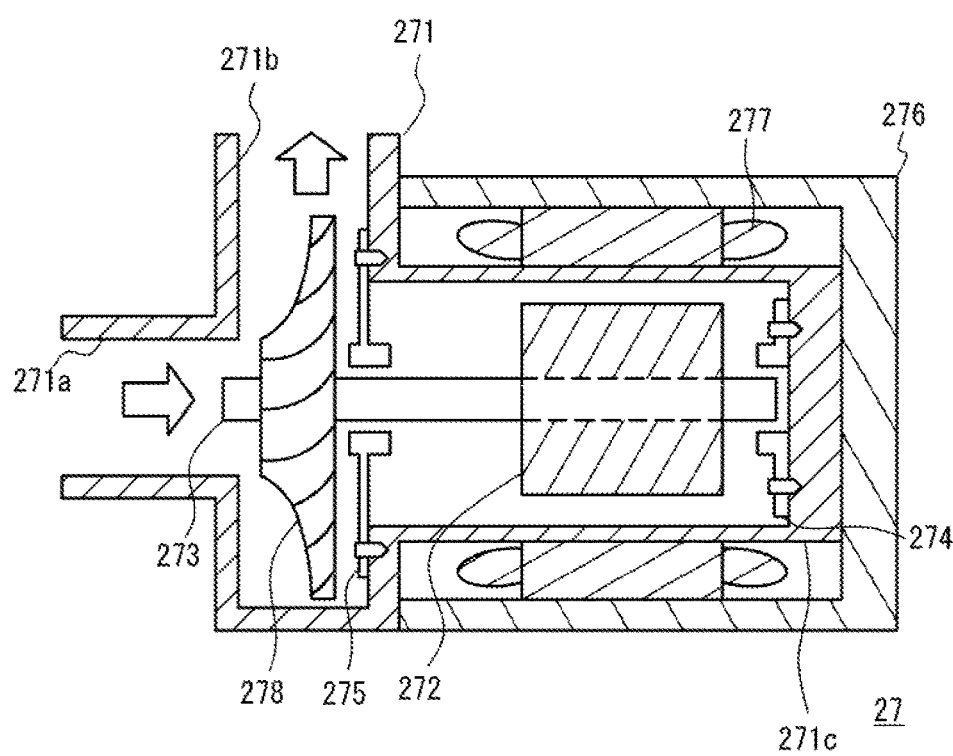
FIG. 11 is an explanatory diagram schematically illustrating an outline structure of a canned pump that can be employed instead of the magnet pump.

The pump 17 in the present embodiment is a magnet pump, but a canned pump 27 illustrated in FIG. 11 may be employed instead of a magnet pump. The canned pump 27 is also an example of the sealed pump.

As illustrated in FIG. 11, the canned pump 27 includes a sealed case 271. The sealed case 271 includes an inlet 271a and an outlet 271b for the refrigerant liquid 14. In addition, the sealed case 271 includes a bottomed cylindrical rotor housing portion 271c that houses a rotor 272. The rotor 272 is attached to a rotor shaft 273. The rotor shaft 273 is rotatably supported by a first bearing portion 274 located in the bottom of the rotor housing portion 271c and a second bearing portion 275 that is located in the opening of the rotor housing portion 271c. Neither the first bearing portion 274 nor the second bearing portion 275 penetrates through the sealed case 271.

A sealing cover 276 is located around the rotor housing portion 271c. A stator 277 is located in the sealing cover 276. The stator 277 is arranged so as to surround the rotor 272 across the sealing cover 276. That is, in the canned pump 27, the combination of the rotor 272 and the stator 277 forms a motor to rotate the rotor shaft 273.

An impeller 278 is attached to the end portion of the rotor shaft 273. Accordingly, when the rotor shaft 273 rotates, the impeller 278 rotates, and the refrigerant liquid 14 introduced from the inlet 271a into the sealed case 271 is discharged from the outlet 271b. As described above, the canned pump 27 seals the rotor shaft 273 with the impeller 278, the first bearing portion 274, and the second bearing portion 275 in the sealed case 271 while the rotor shaft 273, the first bearing portion 274, and the second bearing portion 275 are immersed in the refrigerant liquid 14.

The sealed case 271 is separated from the outside, and seals the refrigerant liquid 14 with a metal. Thus, the canned pump 27 can deal with the leakage of the refrigerant liquid 14 and the erosion of the sealing portion by the refrigerant liquid 14 even when the refrigerant liquid 14 with high penetration is used.

Figure 12:
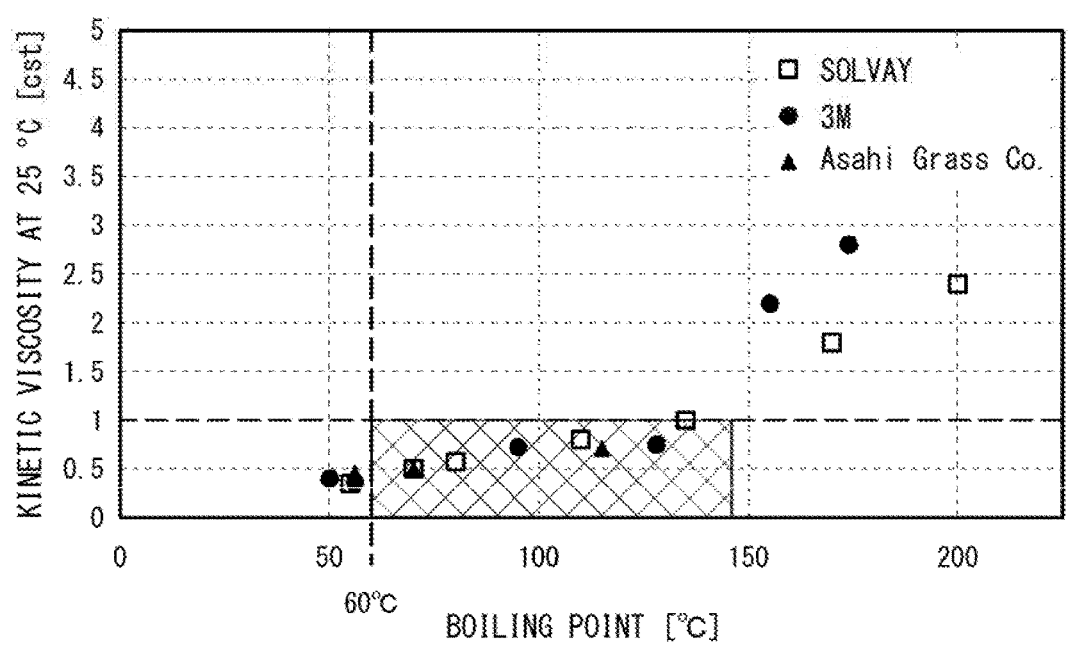
FIG. 12 is a graph illustrating a relationship between the kinetic viscosity at 25° C. and the boiling point of commercially available fluorine-based insulating refrigerants.

Next, with reference to the following Table 2 and the graph illustrated in FIG. 12, selection of a product that can be employed as the refrigerant liquid 14 in the present embodiment among commercially available fluorine-based insulating refrigerants will be examined. The 3M Corporation commercially sells Fluorinert, the Asahi Glass Co., Ltd., commercially sells ASAHIKLIN, and the Solvay commercially sells Galden. These products have different boiling points and different kinetic viscosity at 25° C. Table 2 lists the boiling point and the kinetic viscosity at 25° C. of each product number of each maker. FIG. 12 is a graph in which the values in Table 2 are plotted, and of which the horizontal axis represents the boiling point and the vertical axis represents the kinetic viscosity at 25° C.

Table 2 and the graph illustrated in FIG. 12 reveal that the boiling point correlates with the kinetic viscosity at 25° C. in any product of each maker, and that a product with a higher boiling point has a higher kinetic viscosity at 25° C. Especially, products with a boiling point of 150° C. or greater have a high kinetic viscosity and have a kinetic viscosity at 25° C. of 1 cSt or greater. Therefore, it is determined to be difficult to use these products for the immersion cooling apparatus 12 of the present embodiment using a magnet pump.

The boiling point of 60° C. or greater is also the condition for selection of the refrigerant liquid 14 of the present embodiment. When products that can be used as the refrigerant liquid 14 are selected based on these conditions, Fluorinert FC-770 and FC-3283 suit among the products of 3M. Among the products of Asahi Glass Company, ASAHIKLIN AC-2000 and AC-6000 suit. Among the products of Solvay, Galden HT70, HT80, HT110, and HT135 suit. Although PF-5052 and FC-72 of 3M, AE-3000 of Asahi Glass Co., Ltd., and HT55 of Solvay have low kinetic viscosities at 25° C., they are excluded because their boiling points are 60° C. or less.

TABLE 2

| Product name/ Product Number | Boiling point [° C.] | Kinetic viscosity [cSt@25° C.] |
| --- | --- | --- |
| Fluorinert | 3M | |
| PF-5052 | 50 | 0.4 |
| FC-72 | 56 | 0.38 |
| FC-770 | 95 | 0.79 |
| FC-3283 | 128 | 0.75 |
| FC-40 | 155 | 2.2 |
| FC-43 | 174 | 2.8 |
| ASAHIKLIN | Asahi Glass Co., Ltd. | |
| AE-3000 | 56 | 0.44 |
| AC-2000 | 71 | 0.49 |
| AC-6000 | 115 | 0.71 |
| Galden | Solvay | |
| HT55 | 55 | 0.45 |
| HT70 | 70 | 0.50 |
| HT80 | 80 | 0.57 |
| HT110 | 110 | 0.77 |
| HT135 | 135 | 1.00 |
| HT170 | 170 | 1.80 |
| HT200 | 200 | 2.40 |

Figure 13:
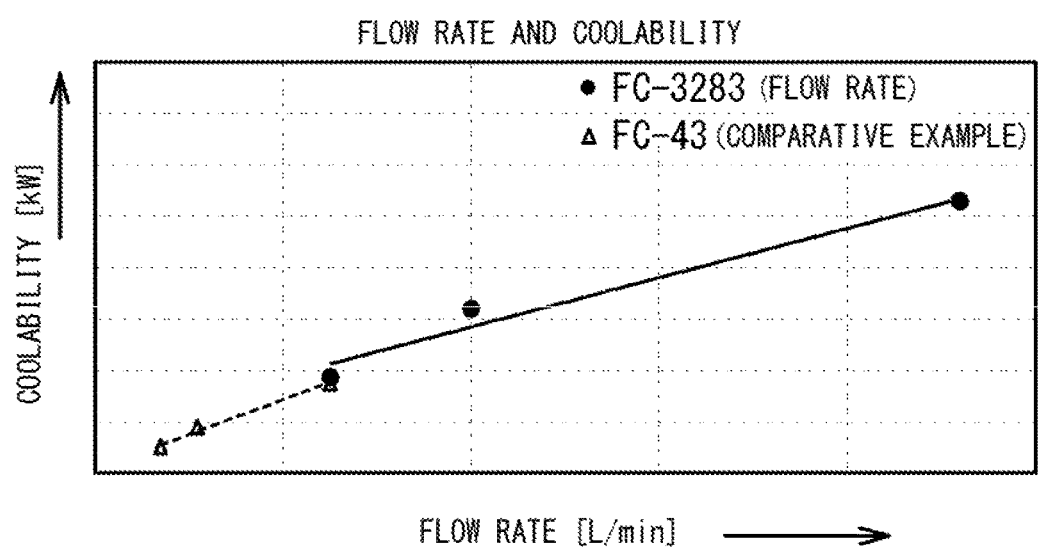
FIG. 13 is a graph illustrating flow rates and coolability of the embodiment and the comparative example.

FIG. 13 is a graph illustrating flow rates and coolability when Fluorinert FC-3283 is employed as the refrigerant liquid 14 of the present embodiment and when Fluorinert FC-43 is employed as a comparative example. Fluorinert FC-43 has a boiling point of 174° C. and a kinetic viscosity at 25° C. of 2.8 cSt. Fluorinert FC-43 has a high boiling point and a high kinetic viscosity at 25° C. Thus, the flow rate per unit time by the pump 17 cannot be gained, and because of this, the coolability is low. On the other hand, Fluorinert FC-3283 that can be employed in the present embodiment has a low boiling point and a low kinetic viscosity at 25° C. Thus, even when the same magnet pump as that of the comparative example is used, the flow rate per unit time is high, and very high coolability can be exhibited.

As described above, in the immersion cooling apparatus 12 of the present embodiment, used is the refrigerant liquid 14 with a boiling point of 60° C. or greater and a kinetic viscosity at 25° C. of 1 cSt or less. This configuration can secure the flow rate per unit time of the refrigerant liquid 14 circulated between the refrigerant tank 20 and the refrigerant cooling device 40 by the pump 17 that is a magnet pump. As described above, since highly efficient coolability is achieved, electrical power consumption can be reduced.

Second Embodiment

Figure 14:
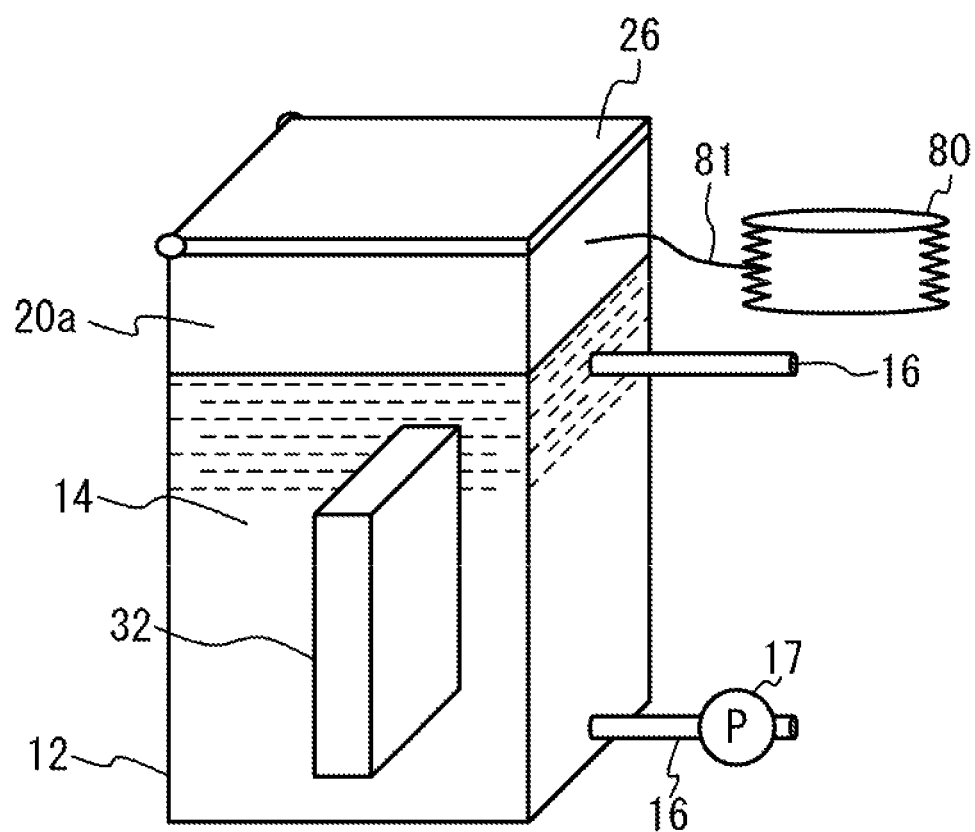
FIG. 14 is an explanatory diagram schematically illustrating an outline structure of a second embodiment.
Figure 15A:
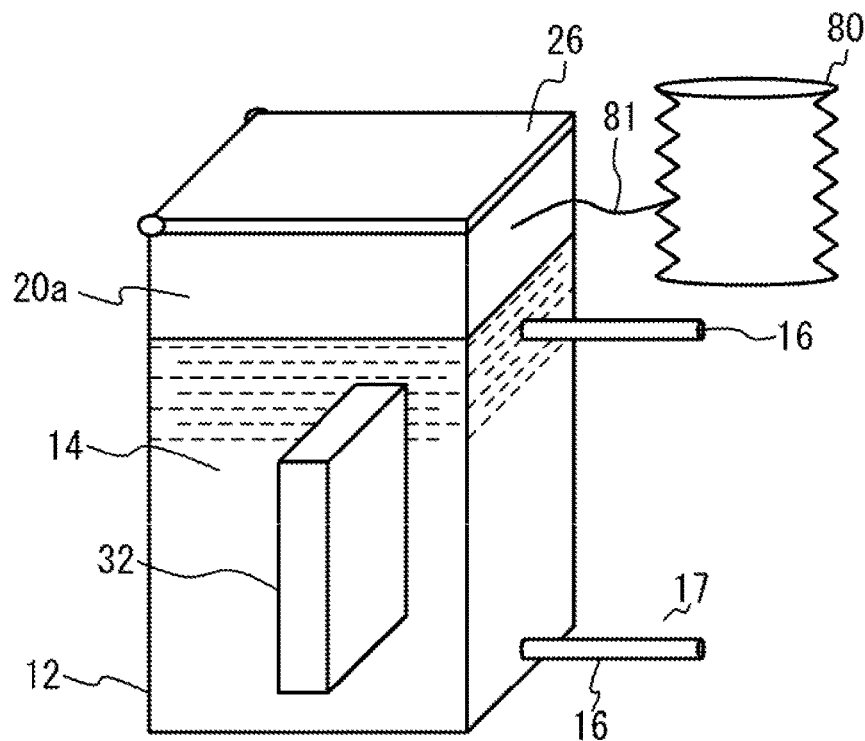
FIG. 15A is an explanatory diagram schematically illustrating a state where an expandable container expands in the second embodiment.
Figure 15B:
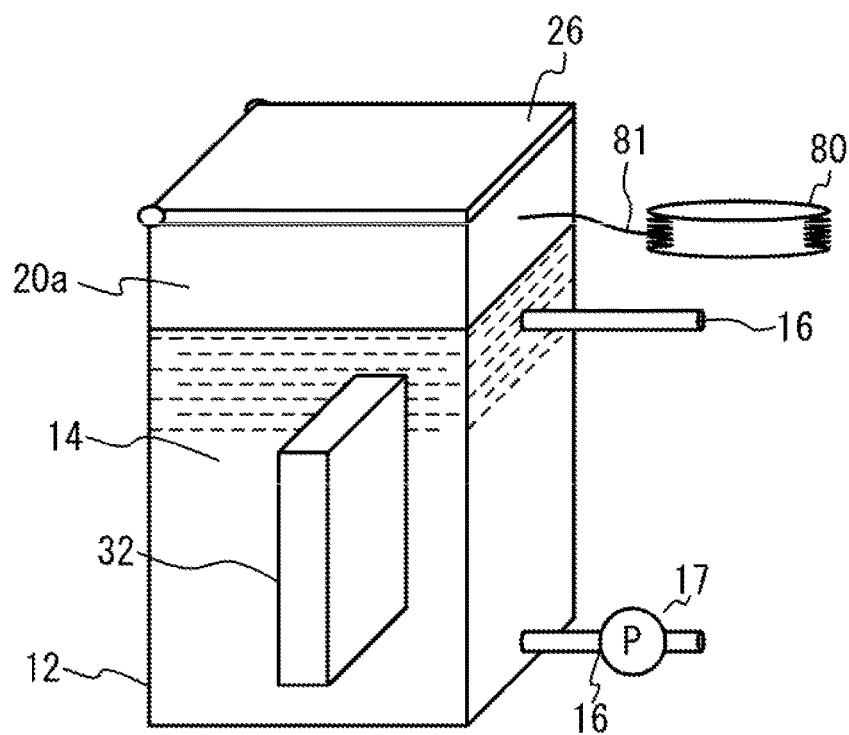
FIG. 15B is an explanatory diagram schematically illustrating a state where the expandable container contracts in the second embodiment.

Next, a second embodiment will be described with reference to FIG. 14, FIG. 15A, and FIG. 15B. FIG. 14 is an explanatory diagram schematically illustrating an outline structure of the second embodiment. FIG. 15A is an explanatory diagram schematically illustrating a state where an expandable container expands in the second embodiment, and FIG. 15B is an explanatory diagram schematically illustrating a state where the expandable container contracts in the second embodiment. In the second embodiment, the same reference numerals are affixed to composition elements same as those of the first embodiment in the drawings, and the detailed description thereof is omitted. In addition, in the drawings for describing the second embodiment, the illustration of the sealed tank 50 included in the first embodiment is omitted. In the second embodiment, only the illustration of the sealed tank 50 is omitted in the drawings, but the embodiment without the sealed tank 50 may be actually employed. The same applies to a third embodiment and embodiments thereafter.

The second embodiment stores a gas storage portion 20a in the upper layer part of the refrigerant tank 20. In addition, provided is an expandable container 80 that is communicated with the gas storage portion 20a and is capable of expansion and contraction. The gas storage portion 20a corresponds to the upper space 20U of the first embodiment.

The second embodiment causes the forced convection of the refrigerant liquid 14 in a non-boiling state as with the first embodiment. Here, since the refrigerant liquid 14 is usually costly, if the refrigerant liquid 14 evaporates, it needs to be refilled, and the maintenance cost thereof is assumed to increase. Thus, the refrigerant tank 20 is made to be a sealed container (a hermetic container) accommodating the refrigerant liquid 14. When the refrigerant tank 20 that is a sealed container is used, the following problems may be caused. If the refrigerant tank 20 has no pressure regulation valve, when the temperature in the refrigerant tank 20 increases, the internal pressure increases because of the pressure increase of the vaporized refrigerant liquid 14 and the air, the production of dissolved air from the refrigerant liquid 14, and the volume expansion of the refrigerant liquid 14 itself. The further increase in internal pressure may damage the refrigerant tank 20.

On the contrary, if the refrigerant tank 20 includes a pressure regulation valve, the increase in internal pressure can be inhibited by the pressure regulation valve, but the vaporized refrigerant liquid 14 leaks to the outside of the refrigerant tank 20, and therefore, the periodic refill of the refrigerant liquid 14 is necessary. Furthermore, even though the pressure regulation valve is provided, when the internal pressure rapidly increases, the discharge of the gas from the pressure regulation valve does not keep up with the increase, and the refrigerant tank 20 may be damaged. In addition, when the inside of the refrigerant tank 20 becomes chilled and in a negative-pressure state, the refrigerant tank lid 26 may not be opened.

Thus, the present embodiment includes, as illustrated in FIG. 14, the expandable container 80 that is communicated with the gas storage portion 20a and is capable of expansion and contraction. The gas storage portion 20a and the expandable container 80 are interconnected by a tube 81. The expandable container 80 of the present embodiment has a so-called bellows shape, but may have a simple bag shape.

The expandable container 80 capable of expansion and contraction has the degree of freedom associated with the installation. For example, to slow the change in pressure inside the refrigerant tank 20, it may be considered to increase the volume of the refrigerant tank 20. However, the increase in the volume of the refrigerant tank 20 results in the increase in size of the immersion cooling apparatus 12. In addition, the refrigerant liquid 14 corresponding to the volume of the refrigerant tank 20 is to be supplied, and thereby, the cost may increase. The expandable container 80 can be easily installed, and can prevent the increase in size of the immersion cooling apparatus 12 and reduce the change in internal pressure of the refrigerant tank 20.

When the refrigerant tank 20 is sealed and the temperature of the refrigerant tank 20 increases, the gas inside the gas storage portion 20a expands in volume, the dissolved air in the refrigerant liquid 14 is produced, or the refrigerant liquid 14 itself expands in volume. As the result, a gas flows from the gas storage portion 20a into the expandable container 80, and the expandable container 80 expands as illustrated in FIG. 15A. On the other hand, when the temperature inside the refrigerant tank 20 decreases, the gas in the gas storage portion 20a contracts in volume, the air dissolves in the refrigerant liquid 14, or the refrigerant liquid 14 itself contracts in volume. As the result, the gas flows out from the expandable container 80, and the expandable container 80 contracts. As described above, when the internal temperature in the refrigerant tank 20 changes, the volume of the gas changes, but the pressure inside the refrigerant tank 20 can be maintained at the pressure (generally, atmospheric pressure) applied to the expandable container 80. In addition, at this time, the leakage of the refrigerant liquid 14 to the outside of the system can be avoided.

The second embodiment can maintain the pressure inside the refrigerant tank 20 at constant pressure even when the temperature inside the refrigerant tank 20 changes. Thus, even when the temperature in the refrigerant tank 20 increases, the leakage of the refrigerant liquid 14 and the damage to the refrigerant tank 20 can be avoided. In addition, even when the temperature inside the refrigerant tank 20 decreases, the refrigerant tank lid 26 or the like can be opened.

Third Embodiment

Figure 16:
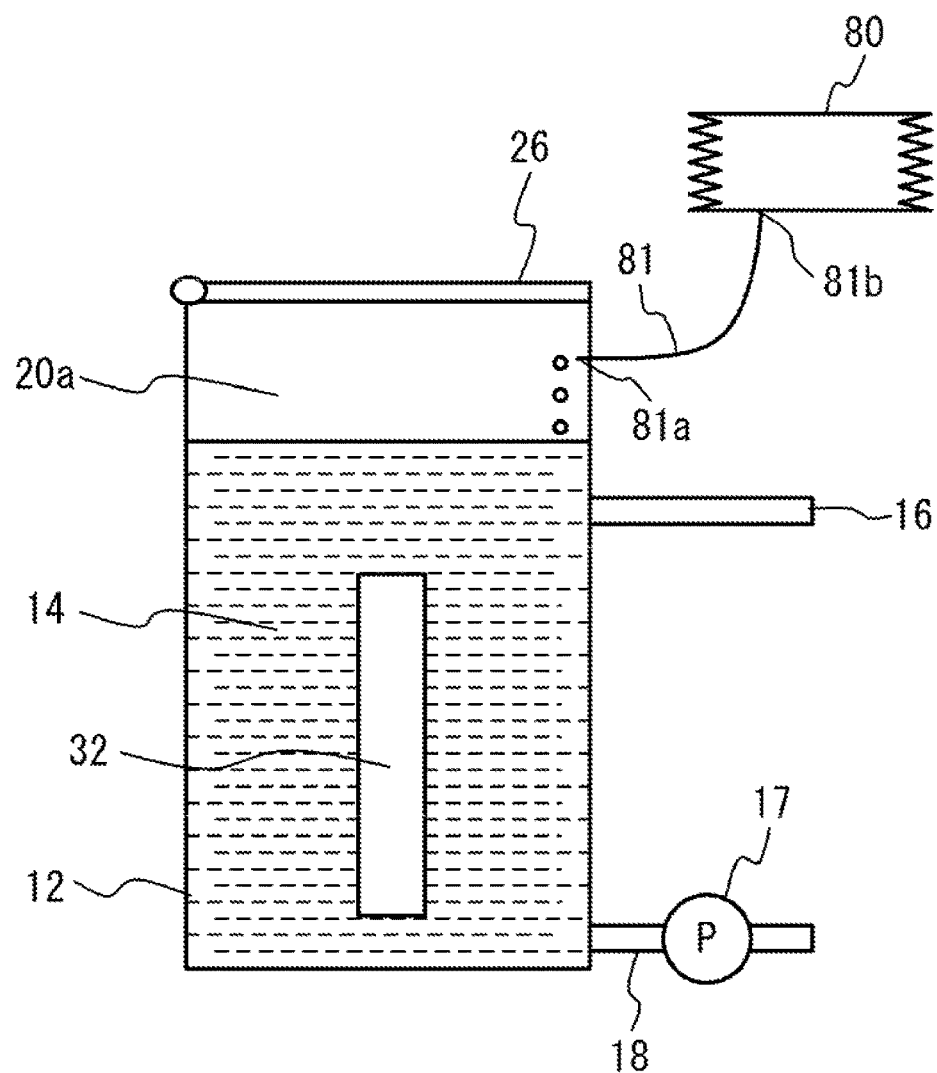
FIG. 16 is an explanatory diagram schematically illustrating an outline structure of a third embodiment.

Next, a third embodiment will be described with reference to FIG. 16. FIG. 16 is an explanatory diagram schematically illustrating an outline structure of the third embodiment.

The third embodiment has almost the same structure as that of the second embodiment except that the expandable container 80 is installed in the different location. In the third embodiment, as in the second embodiment, the gas storage portion 20a and the expandable container 80 are interconnected through the tube 81. A first connection end 81a of the tube 81 is coupled to the gas storage portion 20a. A second connection end 81b of the tube 81 is coupled to the expandable container 80. Here, the first connection end 81a is located lower than the second connection end 81b in the direction of gravitational force. Thus, the refrigerant liquid 14 condensed in the expandable container 80 can be returned to the refrigerant tank 20 by gravity.

Fourth Embodiment

Figure 17:
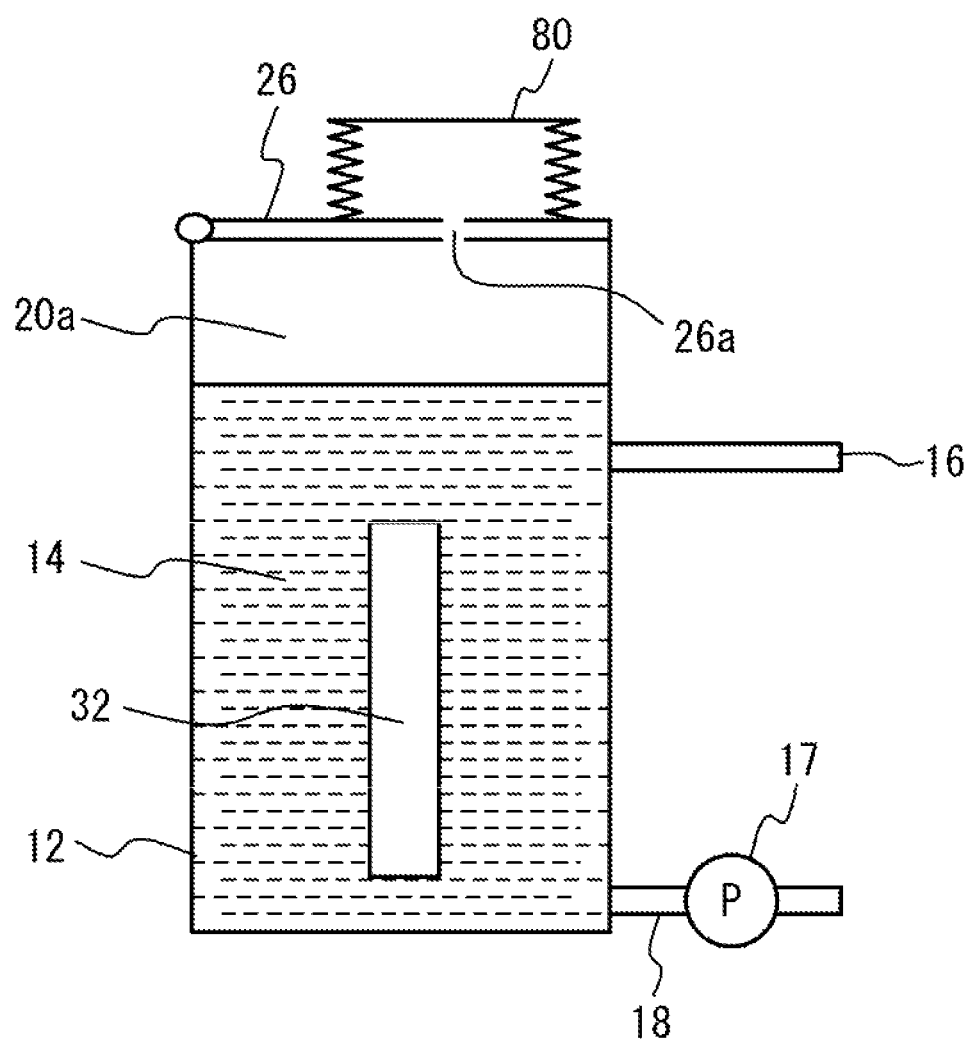
FIG. 17 is an explanatory diagram schematically illustrating an outline structure of a fourth embodiment.

Next, with reference to FIG. 17, a fourth embodiment will be described. FIG. 17 is an explanatory diagram schematically illustrating an outline structure of the fourth embodiment.

The fourth embodiment provides the expandable container 80 on the refrigerant tank lid 26. The refrigerant tank lid 26 includes a continuous hole 26a, and the inside of the expandable container 80 is communicated with the gas storage portion 20a through the continuous hole 26a. Even the above-described structure can achieve the same effect as that of the second embodiment. The expandable container 80 may be located on the side wall of the refrigerant tank 20.

Fifth Embodiment

Figure 18:
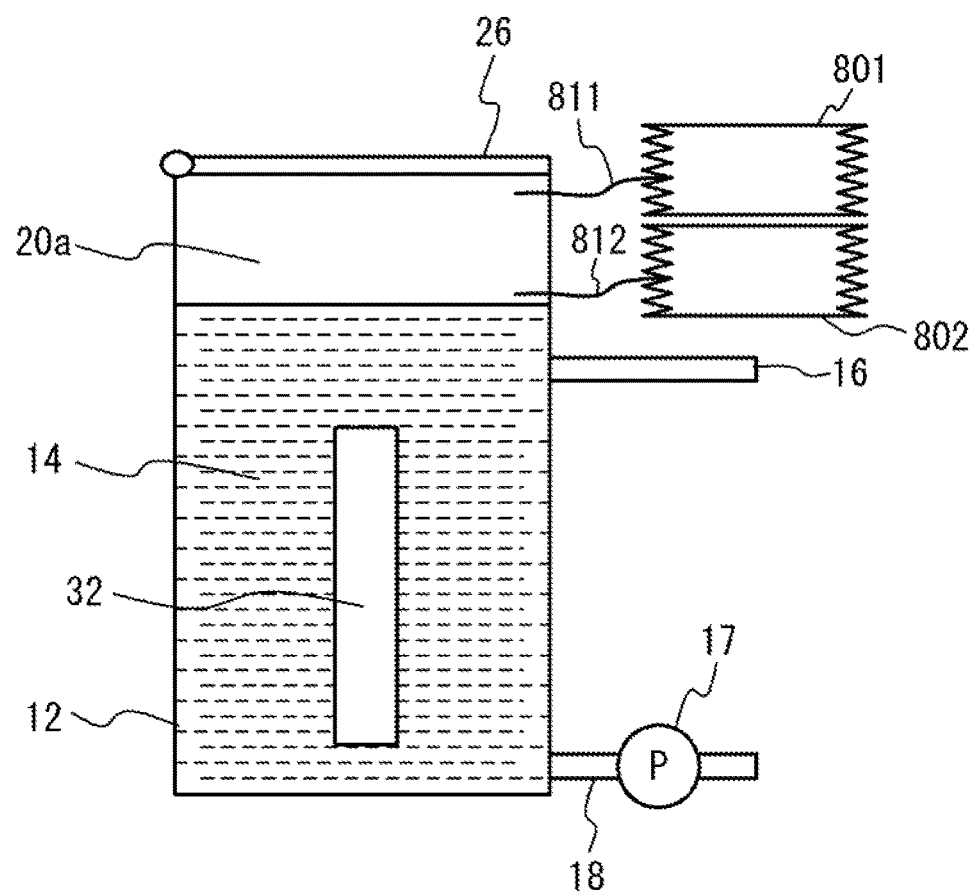
FIG. 18 is an explanatory diagram schematically illustrating an outline structure of a fifth embodiment.

Next, with reference to FIG. 18, a fifth embodiment will be described. FIG. 18 is an explanatory diagram schematically illustrating an outline structure of the fifth embodiment.

The fifth embodiment includes a plurality of expandable containers, i.e., expandable containers 801 and 802. The expandable container 801 is coupled to the gas storage portion 20a through a tube 811. The expandable container 802 is coupled to the gas storage portion 20a through a tube 812. In the present embodiment, the number of expandable containers is two, but may be more than two. Provision of the plurality of expandable containers reduces the size of each expandable container. The reduction of the size of the expandable container can increase the degree of freedom associated with the installation of the expandable container.

Sixth Embodiment

Figure 19:
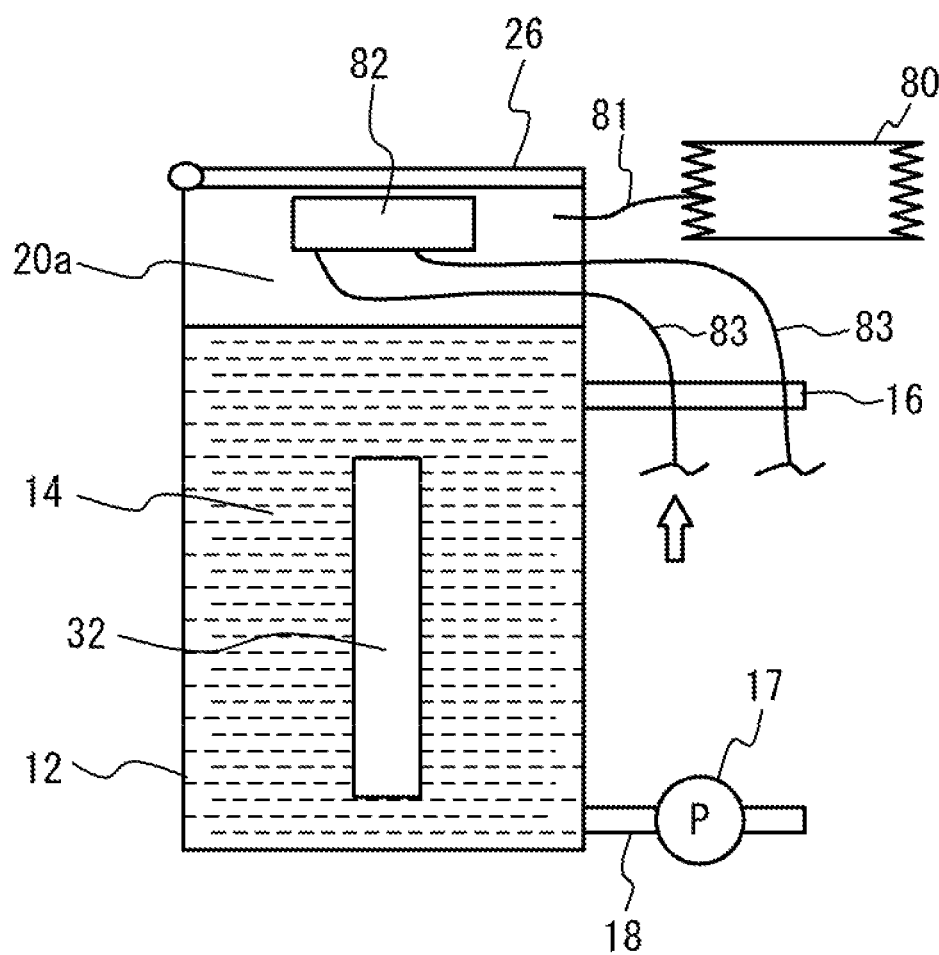
FIG. 19 is an explanatory diagram schematically illustrating an outline structure of a sixth embodiment.

Next, with reference to FIG. 19, a sixth embodiment will be described. FIG. 19 is an explanatory diagram schematically illustrating an outline structure of the sixth embodiment.

The sixth embodiment includes the expandable container 80 as with the second embodiment, and also includes a cooler 82 in the gas storage portion 20a. A cooling water passage 83 is coupled to the cooler 82, allowing cooling water to circulate through the cooler 82. In the present embodiment, the cooling water passage 83 is diverged from the circulation passage 16, but may form a circulation passage different from the circulation passage 16. The volume of gas in the gas storage portion 20a can be reduced by decreasing the temperature of the refrigerant liquid 14 or condensing the refrigerant liquid 14 by the cooler 82. As the result, the size of the refrigerant tank 20 can be reduced. This leads to the reduction of the amount of the refrigerant liquid 14 stored in the refrigerant tank 20, thereby reducing the cost.

Seventh Embodiment

Figure 20:
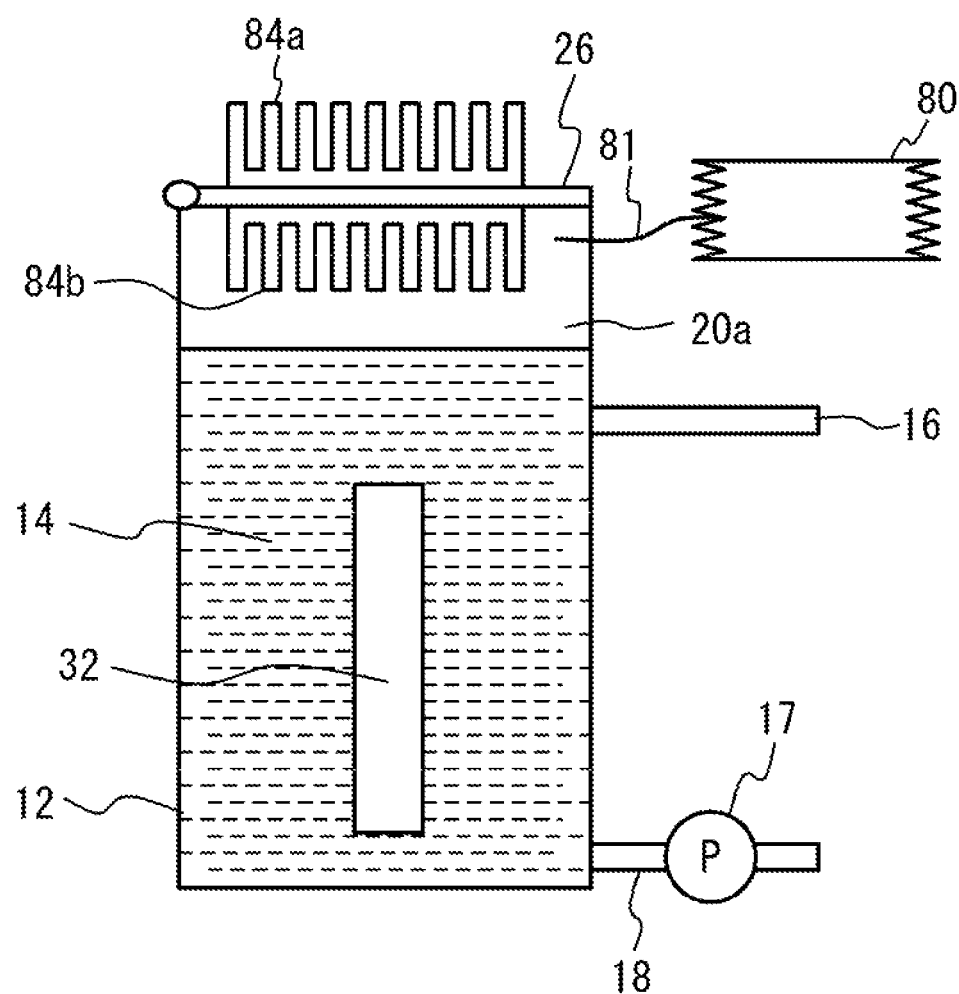
FIG. 20 is an explanatory diagram schematically illustrating an outline structure of a seventh embodiment.

Next, with reference to FIG. 20, a seventh embodiment will be described. FIG. 20 is an explanatory diagram schematically illustrating an outline structure of a seventh embodiment.

The seventh embodiment includes the expandable container 80 as with the second embodiment, and also includes radiating fins 84a on the outer side of the refrigerant tank 20. The radiating fins 84a are an example of the heat release portion. The employment of the radiating fins 84a as the heat release portion can expand the heat release area. The radiating fins 84a of the present embodiment are located on the outer side of the refrigerant tank lid 26. As described above, the provision of the radiating fins 84a cools the refrigerant tank 20, and eventually cools the refrigerant liquid 14. The seventh embodiment further includes heat collection fins 84b on the inner side of the refrigerant tank 20. The heat collection fins 84b are an example of the heat collection portion. The employment of the heat collection fins 84b as the heat collection portion can expand the heat collection area. The heat collection fins 84b of the present embodiment are located on the inner side of the refrigerant tank lid 26. The provision of the heat collection fins 84b takes heat from the gas in the gas storage portion 20a, and can decrease the temperature of the gas in the gas storage portion 20a. The heat collected to the heat collection fins 84b is released through the refrigerant tank lid 26 and the side wall 22S of the refrigerant tank 20. Since the present embodiment includes the radiating fins 84a on the refrigerant tank lid 26, the heat is more effectively released. Although the present embodiment includes both the radiating fin 84a and the heat collection fin 84b, one of them may be provided.

Eighth Embodiment

Figure 21:
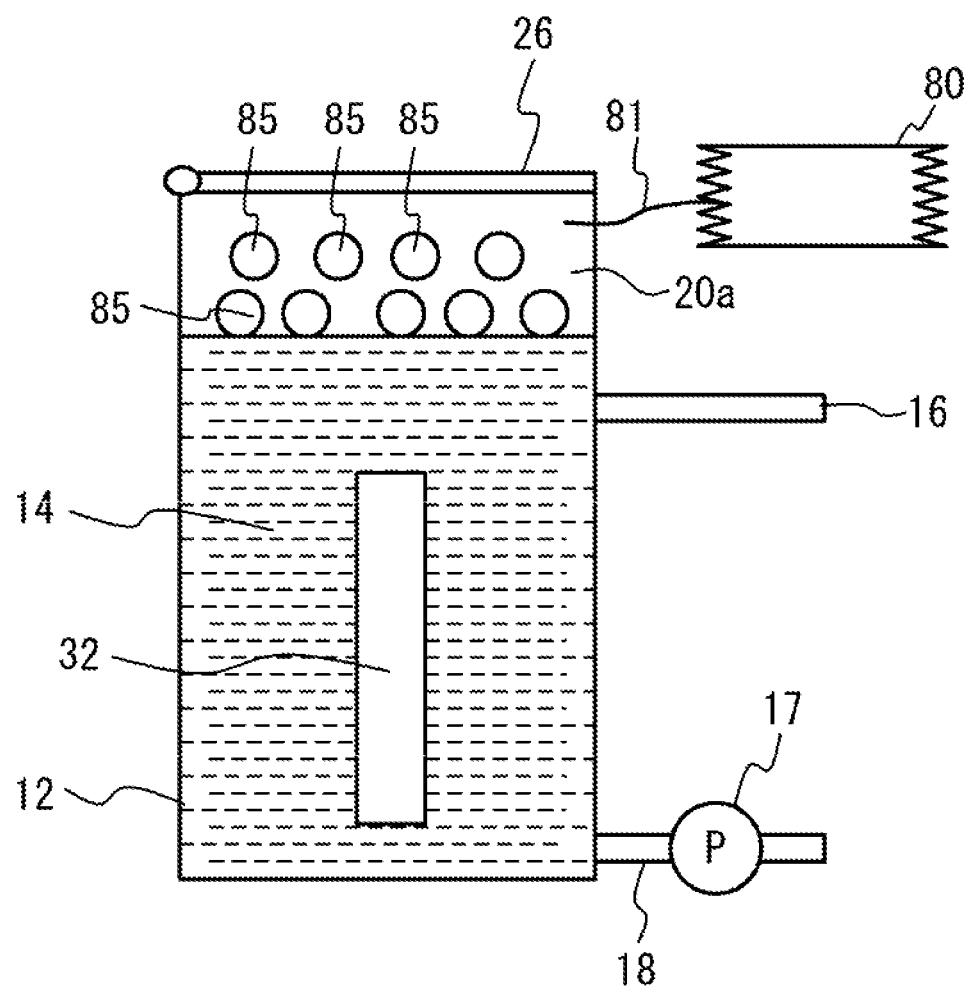
FIG. 21 is an explanatory diagram schematically illustrating an outline structure of an eighth embodiment.

Next, with reference to FIG. 21, an eighth embodiment will be described. FIG. 21 is an explanatory diagram schematically illustrating an outline structure of the eighth embodiment.

The eighth embodiment includes the expandable container 80 as with the second embodiment, and also includes protruding portions 85 that protrude toward the inside of the refrigerant tank 20. A plurality of the protruding portions 85 are located in the gas storage portion 20a. The provision of the protruding portions 85 can reduce the volume inside the gas storage portion 20a. The reduction of the volume inside the gas storage portion 20a can reduce the volume of the gas in the gas storage portion 20a, thereby, reducing the size of the refrigerant tank 20.

Ninth Embodiment

Figure 22:
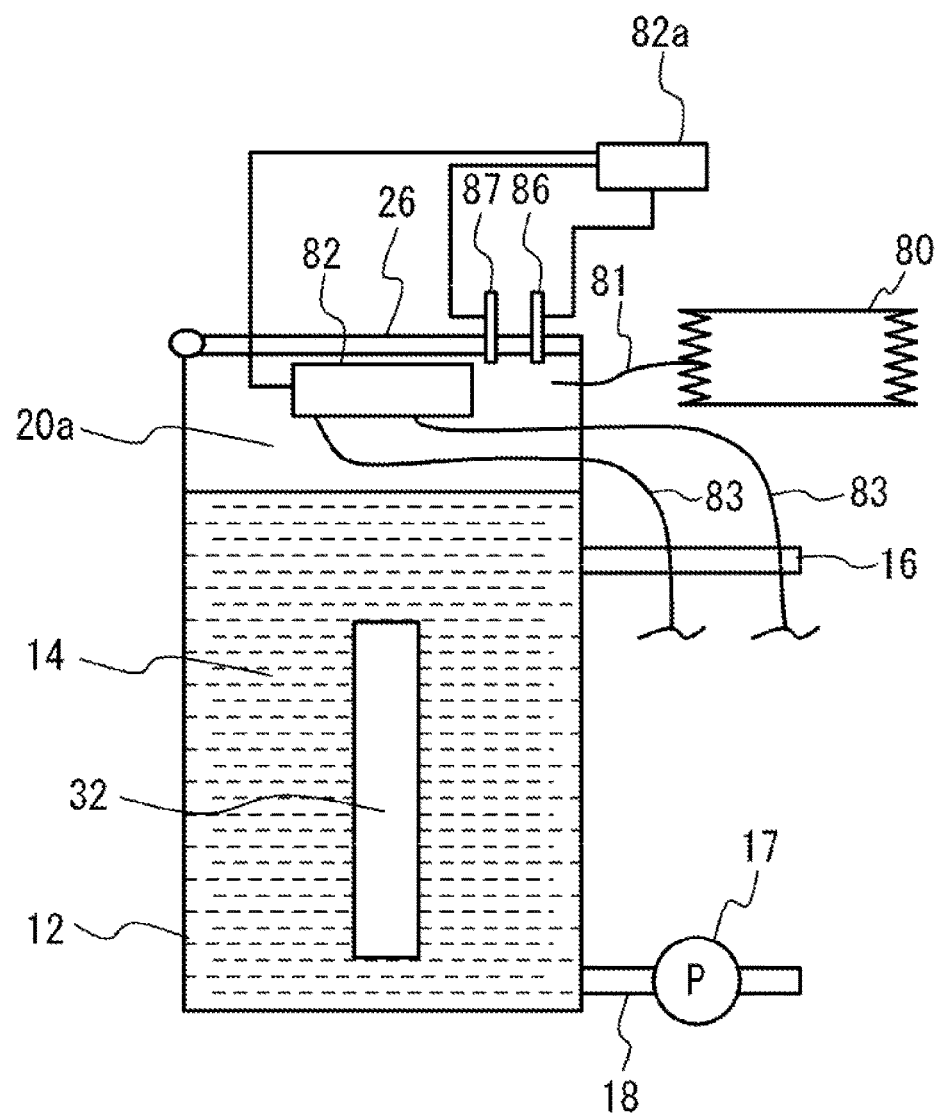
FIG. 22 is an explanatory diagram schematically illustrating an outline structure of a ninth embodiment.
Figure 23:
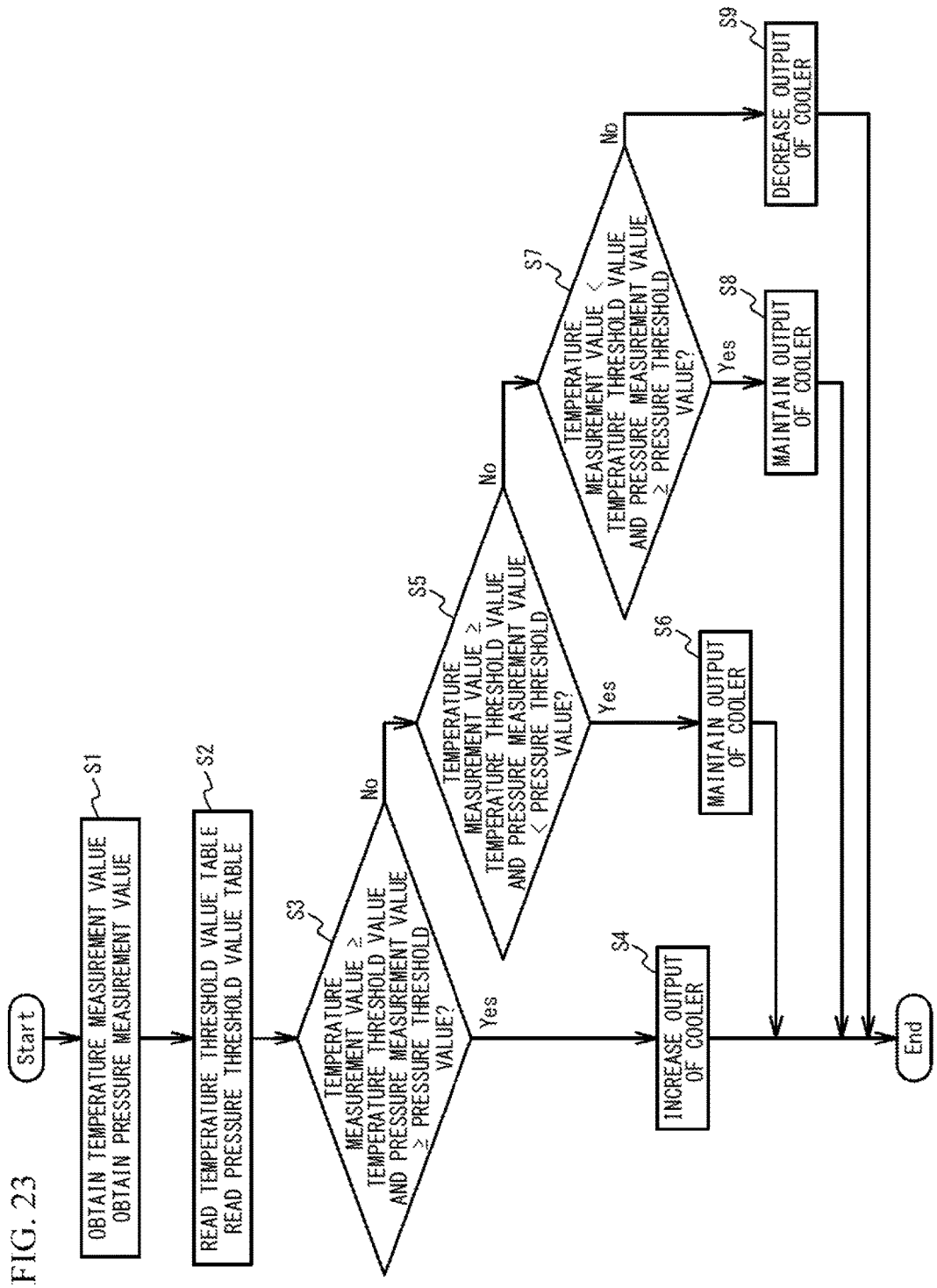
FIG. 23 is a flowchart illustrating a control in the ninth embodiment.

Next, with reference to FIG. 22, a ninth embodiment will be described. FIG. 22 is an explanatory diagram schematically illustrating an outline structure of the ninth embodiment. FIG. 23 is a flowchart illustrating an exemplary control in the ninth embodiment.

The ninth embodiment includes the cooler 82 in the gas storage portion 20a as with the sixth embodiment. The cooling water passage 83 is coupled to the cooler 82, allowing cooling water to circulate through the cooler 82. The ninth embodiment further includes a thermometer 86 that measures temperature in the gas storage portion 20a and a pressure gauge 87 that measures pressure in the gas storage portion 20a. A controller 82a electrically coupled to the thermometer 86, the pressure gauge 87, and the cooler 82 controls the output of the cooler 82 based on measurement values of the thermometer 86 and measurement values of the pressure gauge 87. This configuration allows the state of the refrigerant liquid 14 to be appropriately controlled.

Here, with reference to a flowchart illustrated in FIG. 23, an exemplary control of the cooler 82 will be described. The cooler 82 is configured to adjust the circulation amount of the cooling water flowing through the inside thereof, and the output of the cooler 82 is controlled by the adjustment of the circulation amount. The cooler 82 is controlled at polling intervals preliminarily set. At step S1, a temperature measurement value and a pressure measurement value are obtained. At step S2, a temperature threshold value table and a pressure threshold value table that are set in advance are read.

At step S3 subsequent to step S2, it is determined whether the conditions of the temperature measurement value≥the temperature threshold value and the pressure measurement value≥the pressure threshold value are met. When the determination at step S3 is Yes, the process moves to step S4. At step S4, the output of the cooler 82 is increased. When both the temperature and the pressure are high in the gas storage portion 20a, the output of the cooler 82 is increased to decrease the temperature in the gas storage portion 20a, and eventually decrease the pressure. After step S4, the process ends, and the processes from step S1 are executed again at predetermined polling intervals.

When the determination at step S3 is No, the process moves to step S5. At step S5, it is determined whether the conditions of the temperature measurement value≥the temperature threshold value and the pressure measurement value<the pressure threshold value are met. When the determination at step S5 is Yes, the process moves to step S6. At step S6, the output of the cooler 82 is maintained. Even though the temperature in the gas storage portion 20a is high, when the pressure is less than the threshold value, the output of the cooler 82 is maintained to maintain the state in the gas storage portion 20a. After step S6, the process ends, and the processes after step S1 are executed again at predetermined polling intervals.

When the determination at step S5 is No, the process moves to step S7. At step S7, it is determined whether the conditions of the temperature measurement value<the temperature threshold value and the pressure measurement value≥the pressure threshold value are met. When the determination at step S7 is Yes, the process moves to step S8. At step S8, the output of the cooler 82 is maintained. Even though the pressure in the gas storage portion 20a is high, when the temperature is less than the threshold value, the output of the cooler 82 is maintained to maintain the state in the gas storage portion 20a. After step S8, the process ends, and the processes from step S1 are executed again at predetermined polling intervals.

When the determination at step S7 is No, the process moves to step S9. At step S9, the output of the cooler 82 is decreased. When the state in the gas storage portion 20a is proper, the energy consumption can be reduced by decreasing the output of the cooler 82. After step S9, the process ends, and the processes from step S1 are executed again at predetermined polling intervals.

Tenth Embodiment

Figure 24:
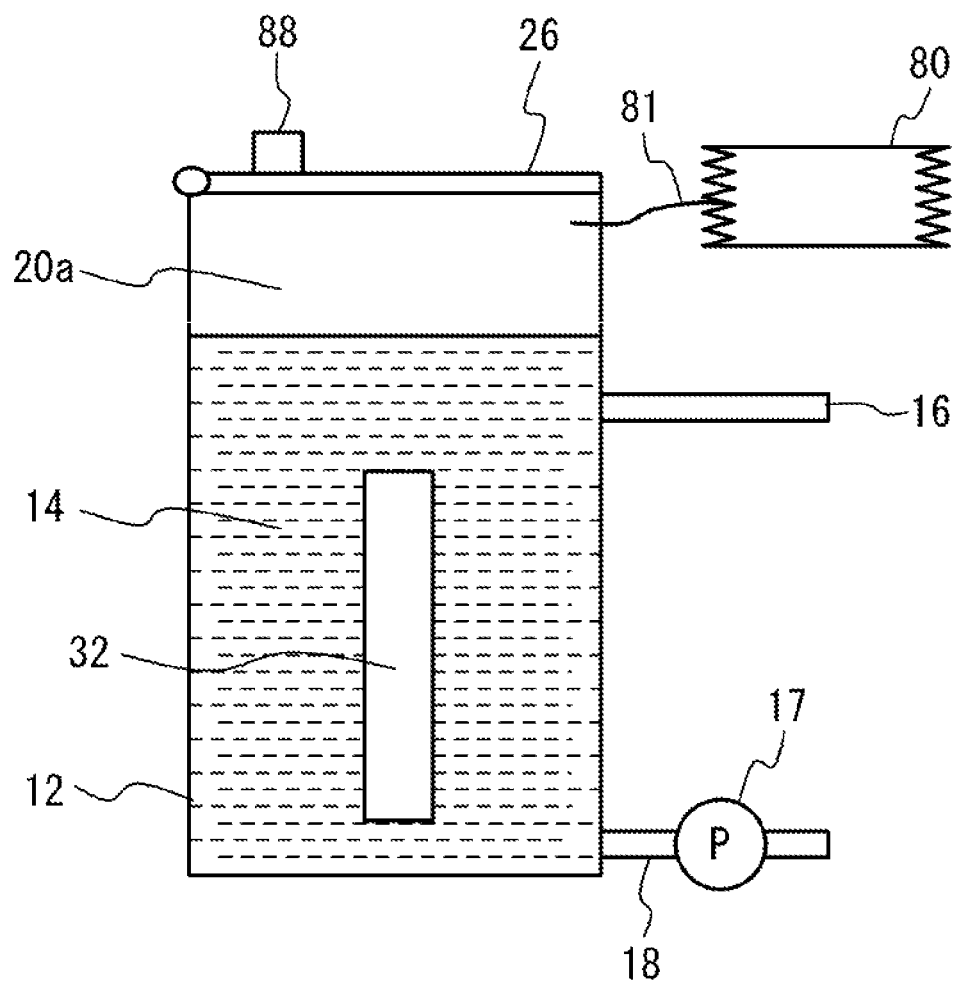
FIG. 24 is an explanatory diagram schematically illustrating an outline structure of a tenth embodiment.

Next, with reference to FIG. 24, a tenth embodiment will be described. FIG. 24 is an explanatory diagram schematically illustrating an outline structure of the tenth embodiment.

The tenth embodiment includes the expandable container 80 as with the second embodiment, and also includes a pressure regulation valve 88 that regulates pressure in the gas storage portion 20a. The pressure regulation valve 88 opens when the pressure of the gas in the gas storage portion 20a becomes equal to or greater than a predetermined value. This configuration can relieve the pressure in the refrigerant tank 20 to inhibit the damage to the refrigerant tank 20 when the pressure increase impossible for the expansion of the expandable container 80 to handle occurs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. An immersion cooling apparatus comprising:
a refrigerant tank configured to store a fluorine-based insulating refrigerant in which an electronic device is to be immersed;
a circulation passage of the fluorine-based insulating refrigerant, which is located between the refrigerant tank and a refrigerant cooler; and
a sealed pump that is arranged in the circulation passage and has an impeller for circulating the fluorine-based insulating refrigerant, the sealed pump including a rotor shaft coupling the impeller and a bearing portion of the rotor shaft, the rotor shaft and the bearing portion being immersed in the fluorine-based insulating refrigerant,
a kinetic viscosity of the fluorine-based insulating refrigerant at 25° C. is 1 centistoke (cSt) or less.
2. The immersion cooling apparatus according to claim 1, wherein the sealed pump is a canned pump or a magnet pump.
3. The immersion cooling apparatus according to claim 1, wherein a boiling point of the fluorine-based insulating refrigerant is 60° C. or greater.
4. The immersion cooling apparatus according to claim 1, wherein the refrigerant tank includes a gas storage portion in an upper layer portion thereof, and further includes an expandable container that is connected to the gas storage portion and is capable of expansion and contraction.
5. The immersion cooling apparatus according to claim 4, wherein the gas storage portion and the expandable container are connected via a tube, and a connection end of the tube with the gas storage portion is located lower than a connection end of the tube with the expandable container in a direction of gravitational force.
6. The immersion cooling apparatus according to claim 4, wherein the expandable container is located on a side wall or lid of the refrigerant tank.
7. The immersion cooling apparatus according to claim 4, further comprising a cooler in the gas storage portion.
8. The immersion cooling apparatus according to claim 7, further comprising:
a thermometer configured to measure temperature in the gas storage portion;
a pressure gauge configured to measure pressure in the gas storage portion; and
a controller configured to control an output of the cooler based on a measurement value of the thermometer and a measurement value of the pressure gauge.
9. The immersion cooling apparatus according to claim 4, further comprising a pressure regulation valve configured to regulate pressure in the gas storage portion.
10. The immersion cooling apparatus according to claim 1, further comprising:
a radiating fin on an outer side of the refrigerant tank; and
a heat collection fin on an inner side of the refrigerant tank.
11. The immersion cooling apparatus according to claim 1, further comprising a protruding portion that protrudes toward an inside of the refrigerant tank.
12. The immersion cooling apparatus according to claim 1, wherein the fluorine-based insulating refrigerant is cooled in a non-boiling state by the cooler while the immersion cooling apparatus operates.

* * * * *